(12) United States Patent
Yamazaki

(10) Patent No.: US 9,741,794 B2
(45) Date of Patent: Aug. 22, 2017

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 32 days.

(21) Appl. No.: 14/450,800

(22) Filed: Aug. 4, 2014

(65) Prior Publication Data

US 2015/0034949 A1  Feb. 5, 2015

(30) Foreign Application Priority Data

Aug. 5, 2013  (JP) .................................. 2013-161960

(51) Int. Cl.
  *H01L 29/10* (2006.01)
  *H01L 29/786* (2006.01)
  (Continued)

(52) U.S. Cl.
  CPC ...... *H01L 29/1054* (2013.01); *H01L 27/1225* (2013.01); *H01L 29/0657* (2013.01);
  (Continued)

(58) Field of Classification Search
  CPC . H01L 29/1054; H01L 29/41; H01L 27/1225; H01L 29/0657; H01L 29/66969; H01L 29/7869; H01L 29/78696
  (Continued)

(56) References Cited

U.S. PATENT DOCUMENTS 5,731,856 A  3/1998 Kim et al.
5,744,864 A  4/1998 Cillessen et al.
    (Continued)

FOREIGN PATENT DOCUMENTS

EP  1737044 A  12/2006
EP  2226847 A  9/2010
    (Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Duy T Nguyen
(74) *Attorney, Agent, or Firm* — Fish & Richardson P.C.

(57) ABSTRACT

Provided is a semiconductor device having a structure which can prevent deterioration of the electrical characteristics, which becomes more significant with miniaturization. The semiconductor device includes a first oxide semiconductor film over an insulating surface; a second oxide semiconductor film over the first oxide semiconductor film; a third oxide semiconductor film over the second oxide semiconductor film; a source electrode and a drain electrode each in contact with side surfaces of the first oxide semiconductor film, the second oxide semiconductor film, and the third oxide semiconductor film and a top surface of the third oxide semiconductor film; a gate insulating film over the third oxide semiconductor film, the source electrode, and the drain electrode; and a gate electrode which is on and in contact with the gate insulating film and faces a top surface and a side surface of the second oxide semiconductor film.

13 Claims, 28 Drawing Sheets

(51) Int. Cl.
*H01L 29/66* (2006.01)
*H01L 29/06* (2006.01)
*H01L 27/12* (2006.01)

(52) U.S. Cl.
CPC .... *H01L 29/66969* (2013.01); *H01L 29/7869* (2013.01); *H01L 29/78696* (2013.01)

(58) Field of Classification Search
USPC ............................................ 257/43; 438/104
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 8,237,166 | B2 | 8/2012 | Kumomi et al. |
| 8,384,080 | B2 | 2/2013 | Taniguchi et al. |
| 8,547,771 | B2 | 10/2013 | Koyama |
| 8,692,252 | B2 | 4/2014 | Takata et al. |
| 8,748,881 | B2 | 6/2014 | Yamazaki |
| 8,901,557 | B2 | 12/2014 | Yamazaki |
| 9,153,699 | B2 | 10/2015 | Yamazaki |
| 9,209,307 | B2 | 12/2015 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0181565 | A1* | 7/2010 | Sakata .................. C23C 14/086 257/43 |
| 2011/0140100 | A1* | 6/2011 | Takata ................ H01L 29/7869 257/43 |
| 2012/0132903 | A1* | 5/2012 | Yamazaki ........... H01L 21/0242 257/43 |
| 2013/0320334 | A1 | 12/2013 | Yamazaki et al. |
| 2014/0042437 | A1 | 2/2014 | Yamazaki |
| 2014/0097867 | A1 | 4/2014 | Koyama et al. |
| 2014/0306217 | A1 | 10/2014 | Yamazaki et al. |
| 2014/0319516 | A1 | 10/2014 | Tanaka et al. |
| 2015/0028330 | A1 | 1/2015 | Yamazaki et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165528 | A | 6/2006 |
| JP | 2011-124360 | A | 6/2011 |
| JP | 2011-138934 | A | 7/2011 |

(56) References Cited

FOREIGN PATENT DOCUMENTS

| JP | 2012-257187 A | 12/2012 |
|---|---|---|
| WO | WO-2004/114391 | 12/2004 |
| WO | 2012/017843 A1 | 2/2012 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a $Zn_4s$ conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

108 Id-Vg characteristics before process

109 Id-Vg characteristics after process

SEMICONDUCTOR DEVICE AND METHOD FOR MANUFACTURING SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a semiconductor device or a method for manufacturing a semiconductor device.

In this specification, a semiconductor device generally means a device which can function by utilizing semiconductor characteristics. A display device, an electro-optical device, a semiconductor circuit, and an electric device may include a semiconductor device.

2. Description of the Related Art

Attention has been focused on a technique for formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and in addition, an oxide semiconductor has been attracting attention.

For example, Patent Document 1 discloses a transistor including an amorphous oxide semiconductor film containing indium (In), gallium (Ga), and zinc (Zn).

Patent Documents 2 and 3 disclose techniques for improving carrier mobility by stacking oxide semiconductor films.

A transistor including an oxide semiconductor film is known to have an extremely low leakage current in an off state. For example, a CPU with low-power consumption utilizing the low leakage current of the transistor including an oxide semiconductor film is disclosed (see Patent Document 4).

REFERENCE

Patent Documents

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187

SUMMARY OF THE INVENTION

Miniaturization of transistors has been progressing with an increase in the degree of integration of circuits. Miniaturization of transistors may cause deterioration of the electrical characteristics of the transistors, such as on-state current, off-state current, threshold voltage, and a subthreshold swing (S value). In general, a decrease in channel length leads to an increase in off-state current, an increase in fluctuation of threshold voltage, and an increase in S value. In addition, a decrease in a channel width leads to a decrease in on-state current.

Thus, an object of one embodiment of the present invention is to provide a semiconductor device having a structure which can prevent deterioration of the electrical characteristics, which becomes more significant with miniaturization. Another object is to provide a highly integrated semiconductor device. Another object is to provide a semiconductor device in which a decrease in on-state current is suppressed. Another object is to provide a semiconductor device with low power consumption. Another object is to provide a semiconductor device with high reliability. Another object is to provide a semiconductor device which can retain data even when power supply is stopped. Another object is to provide a semiconductor device with good characteristics. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first oxide semiconductor film over an insulating surface; a second oxide semiconductor film over the first oxide semiconductor film; a third oxide semiconductor film over the second oxide semiconductor film; a source electrode and a drain electrode each in contact with side surfaces of the first oxide semiconductor film, the second oxide semiconductor film, and the third oxide semiconductor film and a top surface of the third oxide semiconductor film; a gate insulating film over the third oxide semiconductor film, the source electrode, and the drain electrode; and a gate electrode on and in contact with the gate insulating film. The gate electrode faces a top surface and a side surface of the second oxide semiconductor film.

In the above structure, a length of a region where the second oxide semiconductor film and the source electrode overlap with each other in a channel length direction may be shorter than twice a channel length in the second oxide semiconductor film. In addition, a length of a region where the second oxide semiconductor film and the drain electrode overlap with each other in the channel length direction may be shorter than twice the channel length in the second oxide semiconductor film.

Another embodiment of the present invention is a semiconductor device including a first oxide semiconductor film over an insulating surface; a second oxide semiconductor film over the first oxide semiconductor film; a third oxide semiconductor film over the second oxide semiconductor film; a source electrode and a drain electrode each in contact with side surfaces of the first oxide semiconductor film, the second oxide semiconductor film, and the third oxide semiconductor film; a first insulating film over the source electrode; a second insulating film over the drain electrode; a gate insulating film over the third oxide semiconductor film, the source electrode, and the drain electrode; and a gate electrode on and in contact with the gate insulating film. The gate electrode faces a top surface and a side surface of the second oxide semiconductor film.

In the above structure, a top surface of the third oxide semiconductor film may be positioned at the same level as or a higher level than top surfaces of the source electrode and the drain electrode.

Another embodiment of the present invention is a method for manufacturing a semiconductor device, including the steps of: forming a first oxide semiconductor film over an insulating surface; forming a second oxide semiconductor film over the first oxide semiconductor film; forming a third oxide semiconductor film over the second oxide semiconductor film; forming a conductive film over the insulating surface and the third oxide semiconductor film; forming a source electrode and a drain electrode each in contact with side surfaces of the first oxide semiconductor film, the second oxide semiconductor film, and the third oxide semiconductor film and a top surface of the third oxide semiconductor film by etching of the conductive film; forming a gate insulating film over the third oxide semiconductor film, the source electrode, and the drain electrode; and forming a gate electrode on and in contact with the gate insulating film. The gate electrode faces a top surface and a side surface of the second oxide semiconductor film.

Another embodiment of the present invention is a method for manufacturing a semiconductor device, including the steps of: forming a first oxide semiconductor film over an insulating surface; forming a second oxide semiconductor film over the first oxide semiconductor film; forming a third oxide semiconductor film over the second oxide semiconductor film; forming a conductive film over the insulating surface and the third oxide semiconductor film; forming a first insulating film over the conductive film; exposing the third oxide semiconductor film by performing removal treatment on the conductive film and the first insulating film; forming a source electrode, a drain electrode, a second insulating film, and a third insulating film by etching of the conductive film and the first insulating film subjected to the removal treatment; forming a gate insulating film over the third oxide semiconductor film, the source electrode, and the drain electrode; and forming a gate electrode on and in contact with the gate insulating film. The source electrode and the drain electrode are each in contact with side surfaces of the first oxide semiconductor film, the second oxide semiconductor film, and the third oxide semiconductor film. The second insulating film is over the source electrode and the third insulating film is over the drain electrode. The gate electrode faces a top surface and a side surface of the second oxide semiconductor film.

In the above manufacturing method, the removal treatment may be performed by chemical mechanical polishing.

One embodiment of the present invention can provide any of the following semiconductor devices: a semiconductor device in which deterioration of electrical characteristics, which becomes more noticeable with miniaturization, can be prevented; a highly integrated semiconductor device; a semiconductor device in which a decrease in on-state current is suppressed; a semiconductor device with low power consumption; a highly reliable semiconductor device; and a semiconductor device which can retain data even when power supply is stopped.

DETAILED DESCRIPTION OF THE INVENTION

Figure 1A:
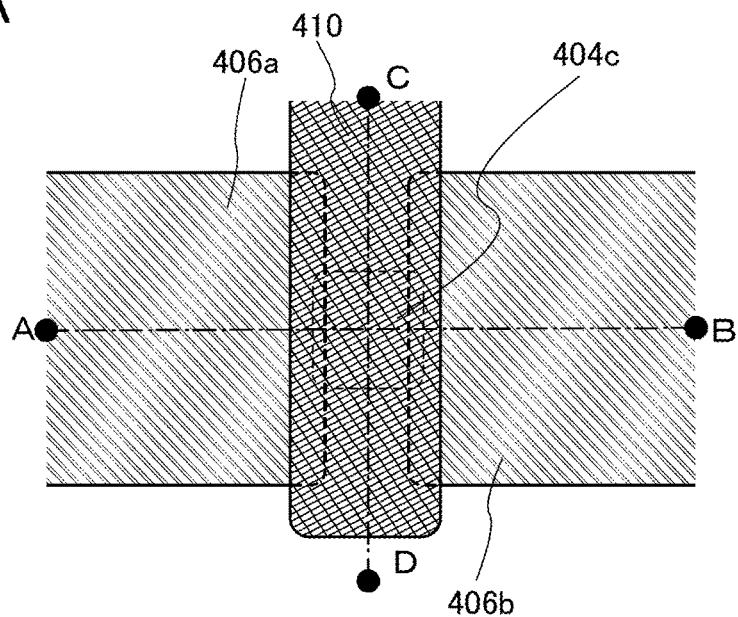
FIGS. 1A to 1C are a top view and cross-sectional views illustrating a transistor.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that what is described (or part thereof) in an embodiment can be applied to, combined with, or exchanged with another content in the same embodiment and/or what is described (or part thereof) in another embodiment or other embodiments.

Note that in each embodiment, a content described in the embodiment is a content described with reference to a variety of diagrams or a content described with a text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, a semiconductor device of one embodiment of the present invention will be described with reference to drawings.

Figure 1B:
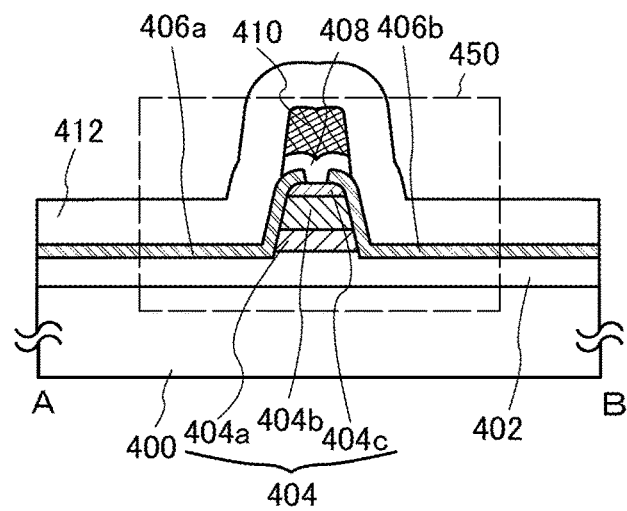
Figure 1C:
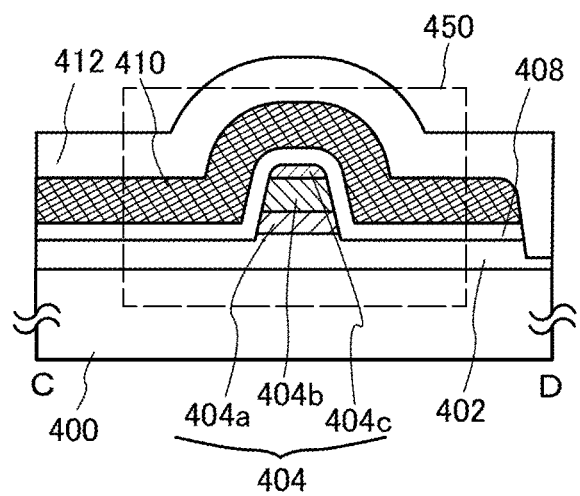

FIGS. 1A to 1C are a top view and cross-sectional views illustrating a transistor of one embodiment of the present invention. FIG. 1A is a top view. FIG. 1B illustrates a cross section taken along dashed-dotted line A-B of FIG. 1A. FIG. 1C illustrates a cross section taken along dashed-dotted line C-D of FIG. 1A. Note that some components are not illustrated in the top view of FIG. 1A for simplification. The direction of the dashed-dotted line A-B and the direction of the dashed-dotted line C-D can be referred to as a channel length direction and a channel width direction, respectively.

A transistor 450 illustrated in FIGS. 1A to 1C includes a base insulating film 402 having a depressed portion and a projected portion over a substrate 400; a first oxide semiconductor film 404a, a second oxide semiconductor film 404b, and a third oxide semiconductor film 404c over the projected portion of the base insulating film 402; a source electrode 406a and a drain electrode 406b each in contact with side surfaces of the first oxide semiconductor film 404a, the second oxide semiconductor film 404b, and the third oxide semiconductor film 404c and the top surface of the third oxide semiconductor film 404c; a gate insulating film 408 over the third oxide semiconductor film 404c, the source electrode 406a, and the drain electrode 406b; a gate electrode 410 on and in contact with the gate insulating film 408; and an oxide insulating film 412 over the source electrode 406a, the drain electrode 406b, and the gate electrode 410. The gate electrode 410 faces the top surface and a side surface of the second oxide semiconductor film 404b. The first oxide semiconductor film 404a, the second oxide semiconductor film 404b, and the third oxide semiconductor film 404c are collectively referred to as a multilayer film 404.

Note that a channel length means a distance between a source (a source region or a source electrode) and a drain (a drain region or a drain electrode) in a region where a semiconductor film and a gate electrode overlap with each other in a top view. Accordingly, in FIG. 1A, the channel length is a distance between the source electrode 406a and the drain electrode 406b in a region where the second oxide semiconductor film 404b and the gate electrode 410 overlap with each other. A channel width means a length of a region where a source faces parallel to a drain and where a semiconductor film and a gate electrode overlap with each other. Accordingly, in FIG. 1A, the channel width is a length of a region where the source electrode 406a and the drain electrode 406b face each other and where the second oxide semiconductor film 404b and the gate electrode 410 overlap with each other.

In fabricating a transistor with a small channel length and a small channel width, an electrode, a semiconductor film, or the like is processed while a resist mask is reduced in size and consequently has a round end portion (curved surface) in some cases. With this structure, the coverage with the gate insulating film 408, the gate electrode 410, and the oxide insulating film 412, which are to be formed over the second oxide semiconductor film 404b, can be improved. In addition, electric field concentration which might occur at end portions of the source electrode 406a and the drain electrode 406b can be reduced, which can suppress deterioration of the transistor.

A high current can flow in the whole (bulk) of the second oxide semiconductor film 404b in which a channel is formed, because the side surfaces of the source electrode 406a and the drain electrode 406b are in contact with side surfaces of the second oxide semiconductor film 404b, so that a high on-state current can be obtained.

Miniaturization of a transistor leads to high integration and high density. Thus, for example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

An electric field from the gate electrode 410 electrically surrounds at least the second oxide semiconductor film 404b in the channel width direction, which increases on-state current. Such a transistor structure is referred to as a surrounded channel (s-channel) structure. Note that in the s-channel structure, current flows in the whole of the second oxide semiconductor film 404b. When current flows in an inner part of the multilayer film 404 (the whole of the second oxide semiconductor film 404b), the current is hardly affected by interface scattering, leading to a high on-state current. Note that when the second oxide semiconductor film 404b is thick, the on-state current can be further increased. Furthermore, the gate electrode 410 extending lower than the interface between the first oxide semiconductor film 404a and the second oxide semiconductor film 404b toward the base insulating film 402 side does not affect the channel width. Thus, the channel width can be reduced, achieving high density (high integration).

The substrate 400 is not limited to a simple supporting substrate, and may be a substrate where a device such as a transistor is formed. In that case, at least one of the gate electrode 410, the source electrode 406a, and the drain electrode 406b of the transistor 450 may be electrically connected to the above device.

The base insulating film 402 can have a function of supplying oxygen to the multilayer film 404 as well as a function of preventing diffusion of impurities from the substrate 400. For this reason, the base insulating film 402 is preferably an insulating film containing oxygen and more preferably, the base insulating film 402 is an insulating film containing oxygen in which the oxygen content is higher than that in the stoichiometric composition. Moreover, when the substrate 400 is provided with another device as described above, the base insulating film 402 also has a function as an interlayer insulating film. In that case, since the base insulating film 402 has an uneven surface, the base insulating film 402 is preferably subjected to planarization treatment such as chemical mechanical polishing (CMP) treatment so as to have a flat surface.

In a region of the transistor 450 where a channel is formed, the multilayer film 404 has a structure in which the first oxide semiconductor film 404a, the second oxide semiconductor film 404b, and the third oxide semiconductor film 404c are stacked in this order from the substrate 400 side. As in FIG. 1C, an electric field from the gate electrode 410 electrically surrounds the second oxide semiconductor film 404b.

Here, for the second oxide semiconductor film 404b, for example, an oxide semiconductor whose electron affinity (an energy difference between a vacuum level and the conduction band minimum) is higher than that of the first oxide semiconductor film 404a and that of the third oxide semiconductor film 404c is used. The electron affinity can be obtained by subtracting an energy difference between the conduction band minimum and the valence band maximum (what is called an energy gap) from an energy difference between the vacuum level and the valence band maximum (what is called an ionization potential).

The first oxide semiconductor film 404a and the third oxide semiconductor film 404c each contain one or more kinds of metal elements contained in the second oxide semiconductor film 404b. For example, the first oxide semiconductor film 404a and the third oxide semiconductor film 404c are preferably formed using an oxide semiconductor whose conduction band minimum is closer to a vacuum level than the conduction band minimum of the second oxide semiconductor film 404b. The energy difference of the conduction band minimum between the second oxide semiconductor film 404b and the first oxide semiconductor film 404a and the energy difference of the conduction band minimum between the second oxide semiconductor film 404b and the third oxide semiconductor film 404c are each preferably greater than or equal to 0.05 eV, 0.07 eV, 0.1 eV, or 0.15 eV and less than or equal to 2 eV, 1 eV, 0.5 eV, or 0.4 eV.

In such a structure, when an electric field is applied to the gate electrode 410, a channel is formed in the second oxide semiconductor film 404b whose conduction band minimum is the lowest in the multilayer film 404. In other words, when the third oxide semiconductor film 404c is formed between the second oxide semiconductor film 404b and the gate insulating film 408, the channel of the transistor is formed in a region which is not in contact with the gate insulating film 408.

Furthermore, because the first oxide semiconductor film 404a contains one or more kinds of metal elements contained in the second oxide semiconductor film 404b, an interface state is less likely to be formed at the interface of the second oxide semiconductor film 404b with the first oxide semiconductor film 404a than at the interface with the base insulating film 402 on the assumption that the second oxide semiconductor film 404b is in contact with the base insulating film 402. The interface state sometimes forms a channel; therefore, the threshold voltage of the transistor is changed in some cases. Thus, with the first oxide semiconductor film 404a, a change in the electrical characteristics of the transistor, such as a threshold voltage, can be reduced. Furthermore, the reliability of the transistor can be improved.

In addition, because the third oxide semiconductor film 404c contains one or more kinds of metal elements contained in the second oxide semiconductor film 404b, scattering of carriers is less likely to occur at the interface of the second oxide semiconductor film 404b with the third oxide semiconductor film 404c than at the interface with the gate insulating film 408 on the assumption that the second oxide semiconductor film 404b is in contact with the gate insulating film 408. Thus, with the third oxide semiconductor film 404c, the field-effect mobility of the transistor can be increased.

For the first oxide semiconductor film 404a and the third oxide semiconductor film 404c, for example, a material containing Al, Ti, Ga, Ge, Y, Zr, Sn, La, Ce, or Hf with a higher atomic ratio than a material used for the second oxide semiconductor film 404b can be used. Specifically, any of the above metal elements in an atomic ratio 1.5 or more times, preferably 2 or more times, further preferably 3 or more times as much as a metal element of the second oxide semiconductor film 404b is contained. Any of the above metal elements is strongly bonded to oxygen and thus has a function of suppressing generation of an oxygen vacancy in the oxide semiconductor films. For this reason, each of the first oxide semiconductor film 404a and the third oxide semiconductor film 404c can be a film in which an oxygen vacancy is less likely to be generated than in the second oxide semiconductor film 404b.

Note that when each of the first oxide semiconductor film 404a, the second oxide semiconductor film 404b, and the third oxide semiconductor film 404c is an In-M-Zn oxide containing at least indium, zinc, and M (M is a metal such as Al, Ti, Ga, Ge, Y, Zr, Sn, La, Ce, or Hf), and the first oxide semiconductor film 404a has an atomic ratio of In to M and Zn which is $x_1:y_1:z_1$, the second oxide semiconductor film 404b has an atomic ratio of In to M and Zn which is $x_2:y_2:z_2$, and the third oxide semiconductor film 404c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 or more times as large as $y_2/x_2$, preferably 2 or more times as large as $y_2/x_2$, further preferably 3 or more times as large as $y_2/x_2$. At this time, when $y_2$ is greater than or equal to $x_2$ in the second oxide semiconductor film 404b, the transistor can have stable electrical characteristics. However, if $y_2$ is 3 or more times as large as $x_2$, the field-effect mobility of the transistor is reduced. For this reason, $y_2$ is preferably smaller than 3 times $x_2$.

In the case where Zn and O are not taken into consideration, the proportion of In and the proportion of M in the first oxide semiconductor film 404a and the third oxide semiconductor film 404c are preferably lower than 50 atomic % and higher than or equal to 50 atomic %, respectively, and further preferably lower than 25 atomic % and higher than or equal to 75 atomic %, respectively. In the case where Zn and O are not taken into consideration, the proportion of In and the proportion of M in the second oxide semiconductor film 404b are preferably higher than or equal to 25 atomic % and lower than 75 atomic %, respectively, and further preferably higher than or equal to 34 atomic % and lower than 66 atomic %, respectively.

The thicknesses of the first oxide semiconductor film 404a and the third oxide semiconductor film 404c are each greater than or equal to 3 nm and less than or equal to 100 nm, preferably greater than or equal to 3 nm and less than or equal to 50 nm. The thickness of the second oxide semiconductor film 404b is greater than or equal to 3 nm and less than or equal to 200 nm, preferably greater than or equal to 3 nm and less than or equal to 100 nm, further preferably greater than or equal to 3 nm and less than or equal to 50 nm. The second oxide semiconductor film 404b is preferably thicker than the first oxide semiconductor film 404a and the third oxide semiconductor film 404c.

For the first oxide semiconductor film 404a, the second oxide semiconductor film 404b, and the third oxide semiconductor film 404c, an oxide semiconductor containing indium, zinc, and gallium can be used, for example. Note that the second oxide semiconductor film 404b preferably contains indium because carrier mobility can be increased.

Note that stable electrical characteristics can be effectively imparted to a transistor including an oxide semiconductor film by reducing the concentration of impurities in the oxide semiconductor film to make the oxide semiconductor film intrinsic or substantially intrinsic. The term "substantially intrinsic" refers to the state where an oxide semiconductor film has a carrier density lower than $1\times10^{17}/cm^3$, preferably lower than $1\times10^{15}/cm^3$, further preferably lower than $1\times10^{13}/cm^3$.

Hydrogen, nitrogen, carbon, silicon, and a metal element other than main components in the oxide semiconductor film are impurities. For example, hydrogen and nitrogen form donor levels to increase the carrier density. Silicon in the oxide semiconductor film forms an impurity level. The impurity level might become a trap, which deteriorates the electrical characteristics of the transistor. Accordingly, in the first oxide semiconductor film 404a, the second oxide semiconductor film 404b, and the third oxide semiconductor film 404c and at interfaces between these films, the impurity concentration is preferably reduced.

In order to make the oxide semiconductor film intrinsic or substantially intrinsic, in secondary ion mass spectrometry (SIMS), for example, the concentration of silicon at a certain depth of the oxide semiconductor film or in a certain region of the oxide semiconductor film is preferably lower than $1\times10^{19}$ atoms/cm$^3$, further preferably lower than $5\times10^{18}$ atoms/cm$^3$, still further preferably lower than $1\times10^{18}$ atoms/cm$^3$. Further, the concentration of hydrogen at a certain depth of the oxide semiconductor film or in a certain region of the oxide semiconductor film is preferably lower than or equal to $2\times10^{20}$ atoms/cm$^3$, further preferably lower than or equal to $5\times10^{19}$ atoms/cm$^3$, still further preferably lower than or equal to $1\times10^{19}$ atoms/cm$^3$, yet still further preferably lower than or equal to $5\times10^{18}$ atoms/cm$^3$. The concentration of nitrogen at a certain depth of the oxide semiconductor film or in a certain region of the oxide semiconductor film is preferably lower than $5\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$.

In the case where the oxide semiconductor film includes a crystal and silicon or carbon is contained at high concentration, the crystallinity of the oxide semiconductor film might be decreased. In order not to lower the crystallinity of the oxide semiconductor film, for example, the concentration of silicon at a certain depth of the oxide semiconductor film or in a certain region of the oxide semiconductor film is preferably lower than $1\times10^{19}$ atoms/cm$^3$, preferably lower than $5\times10^{18}$ atoms/cm$^3$, further preferably lower than $1\times10^{18}$ atoms/cm$^3$. The concentration of carbon at a certain depth of the oxide semiconductor film or in a certain region of the oxide semiconductor film is preferably lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which a highly purified oxide semiconductor film is used for a channel formation region as described above has an extremely low off-state current. When the voltage between a source and a drain is set to about 0.1 V, 5 V, or 10 V, for example, the off-state current standardized on the channel width of the transistor can be as low as several yoctoamperes per micrometer to several zeptoamperes per micrometer.

As in the transistor of one embodiment of the present invention, it is preferable that a portion where a region, which serves as a channel, of the multilayer film is in contact with the gate insulating film be as small as possible for the above-described reason. This is because an insulating film containing silicon is used in many cases as the gate insulating film of the transistor. When a channel is formed at the interface between the gate insulating film and the multilayer film, scattering of carriers may occur at the interface, resulting in a decrease in the field-effect mobility of the transistor. Also from the view of the above, it is preferable that the region of the multilayer film, which serves as a channel, be separated from the gate insulating film.

From the above, the multilayer film 404 has a stacked structure including the first oxide semiconductor film 404a, the second oxide semiconductor film 404b, and the third oxide semiconductor film 404c in this order, a channel can be formed in the second oxide semiconductor film 404b. Thus, the transistor can have a high field-effect mobility and stable electrical characteristics.

Next, the band structure of the multilayer film 404 is described. For analyzing the band structure, a stack corresponding to the multilayer film 404 is formed. In the stacked film, In—Ga—Zn oxide with an energy gap of 3.5 eV is used for layers corresponding to the first oxide semiconductor film 404a and the third oxide semiconductor film 404c, and In—Ga—Zn oxide with an energy gap of 3.15 eV is used for a layer corresponding to the second oxide semiconductor film 404b.

The thickness of each of the first oxide semiconductor film 404a, the second oxide semiconductor film 404b, and the third oxide semiconductor film 404c was 10 nm. The energy gap is measured with the use of a spectroscopic ellipsometer (UT-300 manufactured by HORIBA Jobin Yvon). The energy difference between the vacuum level and the valence band maximum was measured using an ultraviolet photoelectron spectroscopy (UPS) device (VersaProbe, ULVAC-PHI, Inc.).

Figure 2A:
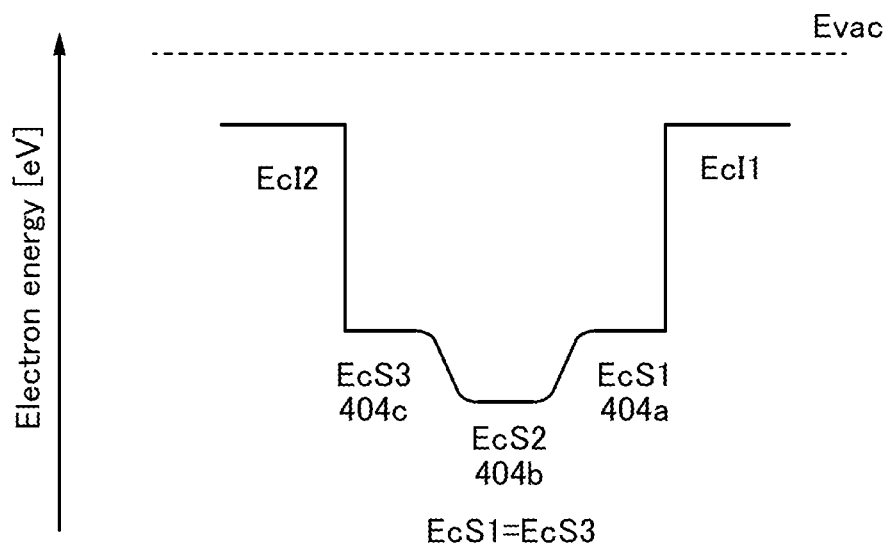
FIGS. 2A and 2B each illustrate a band structure of a multilayer film.

FIG. 2A schematically shows part of a band structure of an energy gap (electron affinity) between the vacuum level and the conduction band minimum of each layer, which is calculated by subtracting the energy gap of each layer from the energy gap between the vacuum level and the valence band maximum. FIG. 2A is a band diagram showing the case where silicon oxide films are provided in contact with the first oxide semiconductor film 404a and the third oxide semiconductor film 404c. Here, Evac represents energy of the vacuum level, EcI1 and EcI2 each represent the conduction band minimum of the silicon oxide film, EcS1 represents the conduction band minimum of the first oxide semiconductor film 404a, EcS2 represents the conduction band minimum of the second oxide semiconductor film 404b, and EcS3 represents the conduction band minimum of the third oxide semiconductor film 404c.

As shown in FIG. 2A, the energies of the conduction band minimums of the first oxide semiconductor film 404a, the second oxide semiconductor film 404b, and the third oxide semiconductor film 404c successively vary. This can be understood also from the fact that a common element is contained in the first oxide semiconductor film 404a, the second oxide semiconductor film 404b, and the third oxide semiconductor film 404c and oxygen is easily diffused among the first oxide semiconductor film 404a, the second oxide semiconductor film 404b, and the third oxide semiconductor film 404c. Thus, the first oxide semiconductor film 404a, the second oxide semiconductor film 404b, and the third oxide semiconductor film 404c have a continuous physical property although they have different compositions and form a stack.

The multilayer film 404 in which layers containing the same main components are stacked is formed to have not only a simple stacked-layer structure of the layers but also a continuous energy band (here, in particular, a well structure having a U shape in which the conduction band minimums are continuously changed between layers). In other words, the stacked-layer structure is formed such that there exists no impurity which forms a defect level such as a trap center or a recombination center at each interface. If impurities exist between the stacked layers in the multilayer film, the continuity of the energy band is lost and carriers disappear by a trap or recombination.

Note that FIG. 2A shows the case where EcS1 and EcS3 are similar to each other; however, EcS1 and EcS3 may be different from each other. For example, part of the band structure in the case where EcS1 is higher than EcS3 is shown in FIG. 2B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the first oxide semiconductor film 404a and the third oxide semiconductor film 404c and an In—Ga—Zn oxide whose atomic ratio of In to Ga and Zn is 1:1:1 or 3:1:2 can be used for the second oxide semiconductor film 404b. When EcS1 is higher than EcS3, an In—Ga—Zn oxide whose atomic ratio of In to Ga and Zn is 1:6:4 or 1:9:6 can be used for the first oxide semiconductor film 404a, an In—Ga—Zn oxide whose atomic ratio of In to Ga and Zn is 1:1:1 or 3:1:2 can be used for the second oxide semiconductor film 404b, and an In—Ga—Zn oxide whose atomic ratio of In to Ga and Zn is 1:3:2, 1:3:3, or 1:3:4 can be used for the third oxide semiconductor film 404c, for example.

Figure 2B:
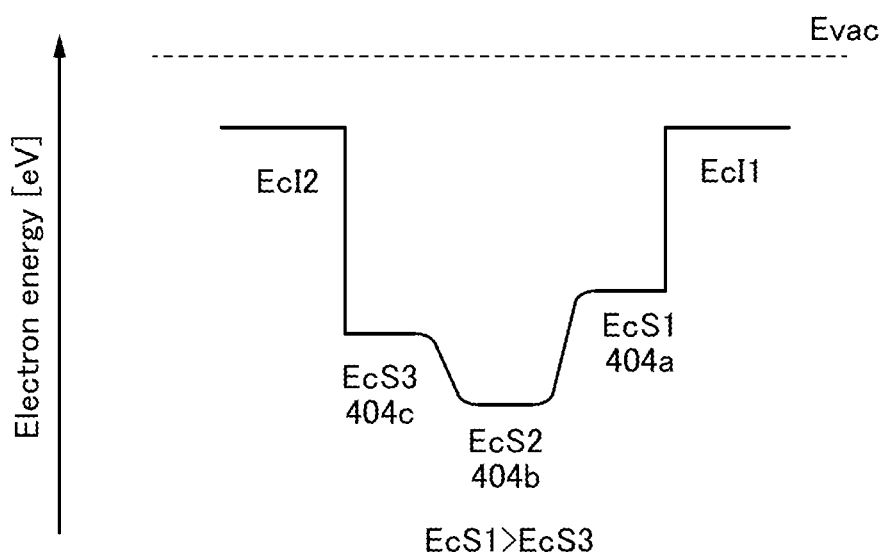

According to FIGS. 2A and 2B, the second oxide semiconductor film 404b of the multilayer film 404 serves as a well, so that a channel is formed in the second oxide semiconductor film 404b in the transistor including the multilayer film 404. Since the energies of the conduction band minimums are continuously changed, the structure of the multilayer film 404 can also be referred to as a U-shaped well. A channel formed to have such a structure can also be referred to as a buried channel.

Note that trap levels due to impurities or defects might be formed in the vicinity of the interface between an insulating film such as a silicon oxide film and each of the first oxide semiconductor film 404a and the third oxide semiconductor film 404c. The second oxide semiconductor film 404b can be distanced away from the trap levels owing to existence of the first oxide semiconductor film 404a and the third oxide semiconductor film 404c. However, when the energy difference between EcS2 and EcS1 or EcS3 is small, an electron in the second oxide semiconductor film 404b might reach the trap level across the energy difference. When the electron is trapped in the trap level, a negative fixed charge is generated at the interface with the insulating film, whereby the threshold voltage of the transistor is shifted in the positive direction.

Thus, to reduce a change in the threshold voltage of the transistor, energy differences between EcS2 and each of EcS1 and EcS3 are necessary. Each of the energy differences is preferably greater than or equal to 0.1 eV, further preferably greater than or equal to 0.15 eV.

The first oxide semiconductor film 404a, the second oxide semiconductor film 404b, and the third oxide semiconductor film 404c preferably include crystal parts. In particular, when a crystal in which c-axes are aligned is used, the transistor can have stable electrical characteristics.

In the case where an In—Ga—Zn oxide is used for the multilayer film 404, it is preferable that the third oxide semiconductor film 404c contain less In than the second oxide semiconductor film 404b so that diffusion of In to the gate insulating film is prevented.

For the source electrode 406a and the drain electrode 406b, a conductive material which can be bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material which can be bonded to oxygen includes, in its category, a material to which oxygen can be diffused.

When the conductive material which can be bonded to oxygen is in contact with a multilayer film, a phenomenon occurs in which oxygen in the multilayer film is diffused to the conductive material which can be bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer film and in contact with the source electrode or the drain electrode. Hydrogen slightly contained in the film enters the site of oxygen vacancies, whereby the region is changed to an n-type region. Thus, the n-type region can serve as a source region or a drain region of the transistor.

In the case of forming a transistor with an extremely short channel length, an n-type region which is formed by the generation of oxygen vacancies might extend in the channel length direction of the transistor, causing a short-circuit. In that case, the electrical characteristics of the transistor are changed by a threshold voltage shift; for example, on and off of the transistor cannot be controlled with a gate voltage at a practical level (in which case the transistor is on). Accordingly, when a transistor with an extremely short channel length is formed, it is not always preferable that a conductive material which is easily bonded to oxygen be used for a source electrode and a drain electrode.

In such a case, a conductive material which is less likely to be bonded to oxygen than the above material is preferably used for the source electrode 406a and the drain electrode 406b. As the conductive material which is not easily bonded to oxygen, for example, a material containing tantalum nitride, titanium nitride, or ruthenium or the like can be used. As a structure in which the conductive material is in contact with the second oxide semiconductor film 404b, a stack including the conductive material and the aforementioned conductive material which is easily bonded to oxygen may be used.

The gate insulating film 408 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 408 may be a stack including any of the above materials. The gate insulating film 408 may contain lanthanum (La), nitrogen, or zirconium (Zr) as an impurity.

When the specific material is used for the gate insulating film, electrons are trapped in the gate insulating film under the specific conditions and the threshold voltage can be increased. For example, like a stacked-layer film of silicon oxide and hafnium oxide, part of the gate insulating film 408 uses a material having a lot of electron trap states, such as hafnium oxide, aluminum oxide, and tantalum oxide, and the state where the potential of the gate electrode is higher than that of the source electrode or the drain electrode is kept for one second or more, specifically one minute or more at a higher temperature (a temperature higher than the operating temperature or the storage temperature of the semiconductor device, or a temperature of 125° C. or higher and 450° C. or lower; a temperature of 150° C. or higher and 300° C. or lower, as a typical example). Thus, electrons are moved from the oxide semiconductor film to the gate electrode, and some of the electrons are trapped by the electron trap states.

In the semiconductor device in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the semiconductor device.

For example, the treatment is preferably performed at any step before factory shipment, such as after the formation of a wire metal connected to the source electrode or the drain electrode of the semiconductor device, after the preceding process (wafer processing), after a wafer-dicing step, after packaging, or the like. In any case, it is preferable that the transistor not be exposed to a temperature higher than or equal to 125° C. for one hour or more after that.

An example in which the gate insulating film is used also as an electron trap layer (a layer containing electron trap states) will be described with reference to simplified cross-sectional views.

Figure 18A:
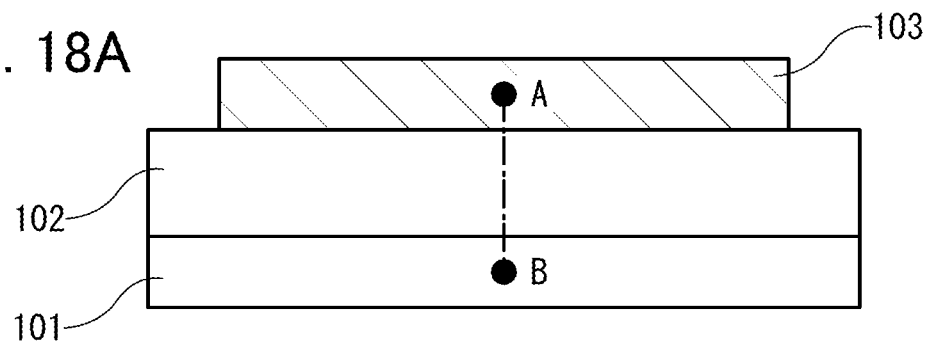
FIGS. 18A to 18C are cross-sectional views of transistors.

FIG. 18A illustrates a semiconductor device including a semiconductor layer 101, an electron trap layer 102, and a gate electrode 103.

Here, for example, the semiconductor layer 101, the electron trap layer 102, and the gate electrode 103 correspond to the multilayer film 404, the gate insulating film 408, and the gate electrode 410, respectively, in FIGS. 1A to 1C.

The electron trap layer 102 contains a material including a state that traps an electron (electron trap state). Alternatively, the electron trap layer 102 is a layer in which an electron has been already trapped by any way or treatment. Further alternatively, the electron trap layer 102 is a layer in which an electron may be trapped by any way or treatment. Depending on the formation method and formation conditions, such a state is not formed even when the electron trap layer 102 is formed of the same constituent elements.

Figure 18B:
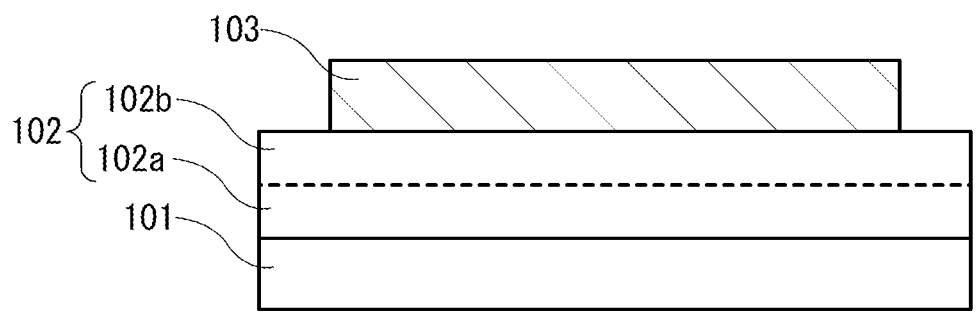
Figure 18C:
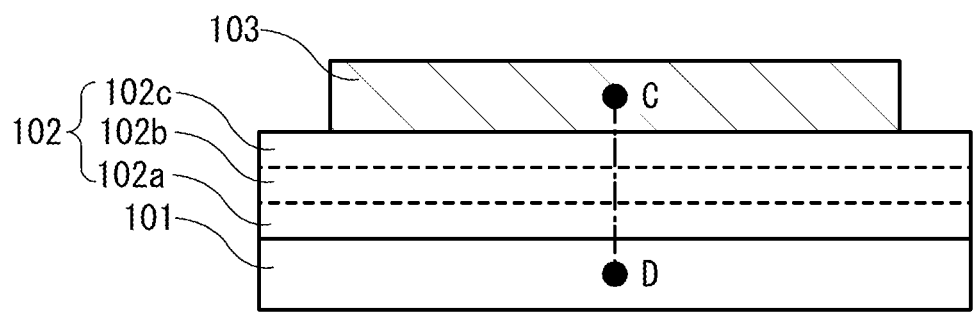

The electron trap layer 102 may be, for example, a stack including a first insulating film 102a formed by a first formation method (or under first formation conditions) and a second insulating film 102b formed by a second formation method (or under second formation conditions) as illustrated in FIG. 18B. Alternatively, the electron trap layer 102 may be a stack including the first insulating film 102a formed by the first formation method (or under the first formation conditions), the second insulating film 102b formed by the second formation method (or under the second formation conditions), and a third insulating film 102c formed by a third formation method (or under third formation conditions) as illustrated in FIG. 18C, or a stack including four or more insulating layers.

Here, the first to third insulating films have the same constituent elements. Note that the first formation method (or the first formation conditions) may be the same as the third formation method (or the third formation conditions).

In this case, it is preferable that the number of electron trap states in a layer that is not in contact with the semiconductor layer 101 (e.g., the second insulating film) be large. For example, an insulating film formed by a sputtering method has a higher density of electron trap states than an insulating film formed by a CVD method or an ALD method and having the same composition.

Accordingly, an insulating film formed by a sputtering method may be used as the second insulating film 102b, and an insulating film formed by a CVD method or an ALD method may be used as the first insulating film 102a. In the case of FIG. 18C, the third insulating film 102c may be formed in the same way as the first insulating film 102a. However, the insulating films are not limited thereto in one embodiment of the present invention; an insulating film formed by a CVD method or an ALD method may be used as the second insulating film 102b, and an insulating film formed by a sputtering method may be used as the first insulating film 102a. In the case of FIG. 18C, the third insulating film 102c may be formed in the same way as the first insulating film 102a.

An insulating film formed by a CVD method can function as a normal gate insulating film and thereby can decrease leakage current between a gate and a drain or a source. In contrast, an insulating film formed by a sputtering method has a high density of electron trap states and thereby can make the threshold voltage of the transistor high. Accordingly, this structure can lead to a low leakage current and appropriate threshold voltage adjustment. For this reason, it is preferable to form a stacked structure using different formation methods (or different formation conditions). Note that one embodiment of the present invention is not limited to these.

Furthermore, for easy successive formation, the same formation method can be used for the semiconductor layer 101 and the first insulating film 102a that is in contact with the semiconductor layer 101. For example, in the case of forming the semiconductor layer 101 by a sputtering method, the first insulating film 102a may also be formed by a sputtering method and the second insulating film 102b may be formed by a CVD method or an ALD method. In the case of FIG. 18C, the third insulating film 102c may also be formed by a sputtering method. Similarly, in the case of forming the semiconductor layer 101 by a CVD method, the first insulating film 102a may also be formed by a CVD method and the second insulating film 102b may be formed by a sputtering method. In the case of FIG. 18C, the third insulating film 102c may also be formed by a CVD method. These structures can lead to a low leakage current, appropriate threshold voltage control, and easy manufacture. Note that one aspect of one embodiment of the present invention is not limited to these structures.

Note that an insulating film formed by a CVD method or an ALD method is preferably formed thicker than an insulating film formed by a sputtering method. This can reduce an electrical breakdown, increase withstand voltage, and decrease leakage current. Note that one embodiment of the present invention is not limited to the examples described above.

Note that the CVD method may be any of a variety of methods: a thermal CVD method, a photo CVD method, a plasma CVD method, an MOCVD method, an LPCVD method, and the like. The insulating films may be formed by different CVD methods.

Figure 19A:
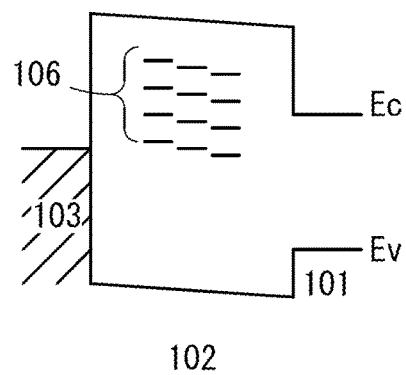
FIGS. 19A to 19D each illustrate a band structure.

FIG. 19A illustrates a band diagram example of the semiconductor device illustrated in FIG. 18A, from point A to point B. In the drawings, Ec represents a conduction band minimum and Ev represents a valence band maximum. In FIG. 19A, the potential of the gate electrode 103 is the same as the potential of a source electrode or a drain electrode (not illustrated).

Figure 19B:
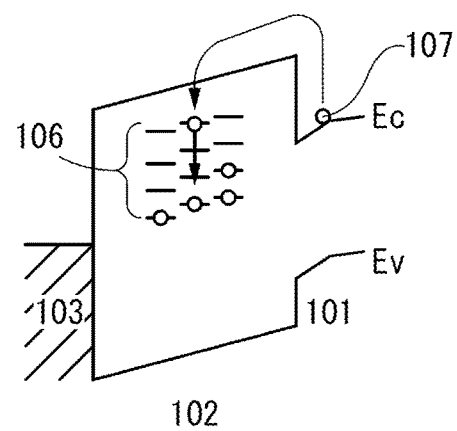

The electron trap states 106 exist inside the electron trap layer 102. FIG. 19B shows the state where the potential of the gate electrode 103 is higher than the potential of the source or drain electrode. The potential of the gate electrode 103 may be higher than the potential of the source or drain electrode by 1 V or more. The potential of the gate electrode 103 after this process may be lower than the highest potential applied to the gate electrode 103, which is typified by less than 4 V.

Electrons 107 that exist in the semiconductor layer 101 move toward the gate electrode 103 having a higher potential. Some of the electrons 107 moving from the semiconductor layer 101 toward the gate electrode 103 are trapped in the electron trap states 106.

To hold electrons trapped by electron trap states inside the second insulating film 102b or at the interface with another insulating film, it is effective that the electron trap layer 102 is formed of three insulating films, which include the same constituent elements, as illustrated in FIG. 18C by different formation methods (or different formation conditions) and that the number of electron trap states in the second insulating film 102b is larger than that of the other films.

Figure 19C:
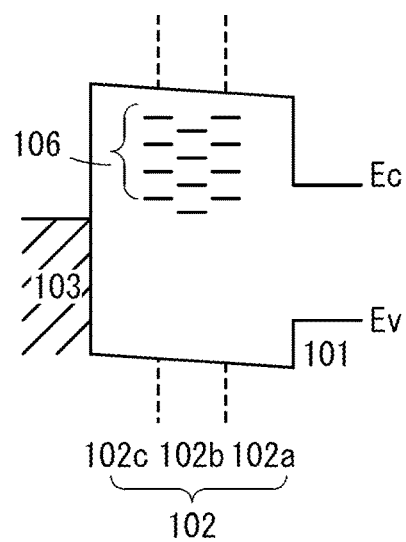

In this case, if the physical thickness of the third insulating film 102c is large enough, electrons trapped by the electron trap states 106 can be held even when the second insulating film 102b has a small thickness. FIG. 19C illustrates a band diagram example of the semiconductor device illustrated in FIG. 18C, from point C to point D. Note that if the formation method (or formation conditions) is different, materials including the same constituent elements have different number of oxygen vacancies or the like and thus may have different Fermi levels. However, in the example described below, it is assumed that such materials have the same Fermi level.

The second insulating film 102b is formed by a formation method (or under formation conditions) that makes the number of electron trap states 106 larger. Accordingly, the number of electron trap states at the interface between the first insulating film 102a and the second insulating film 102b and at the interface between the second insulating film 102b and the third insulating film 102c is large.

Figure 19D:
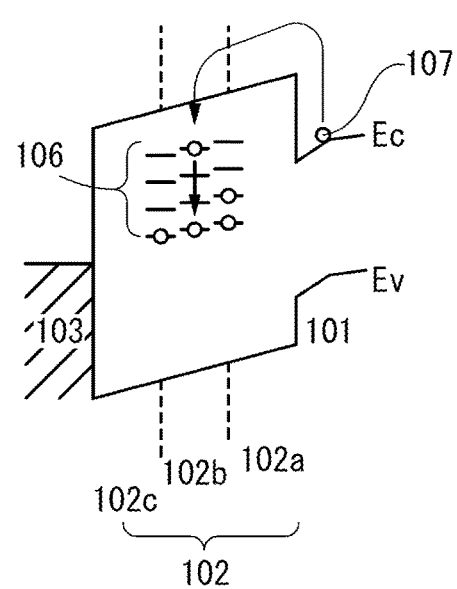

By setting the potential of the gate electrode 103 and the temperature at the above-described conditions, electrons from the semiconductor layer 101 are trapped by the electron trap states 106 as described with FIG. 19B, so that the electron trap layer 102 is negatively charged (see FIG. 19D).

Figure 20A:
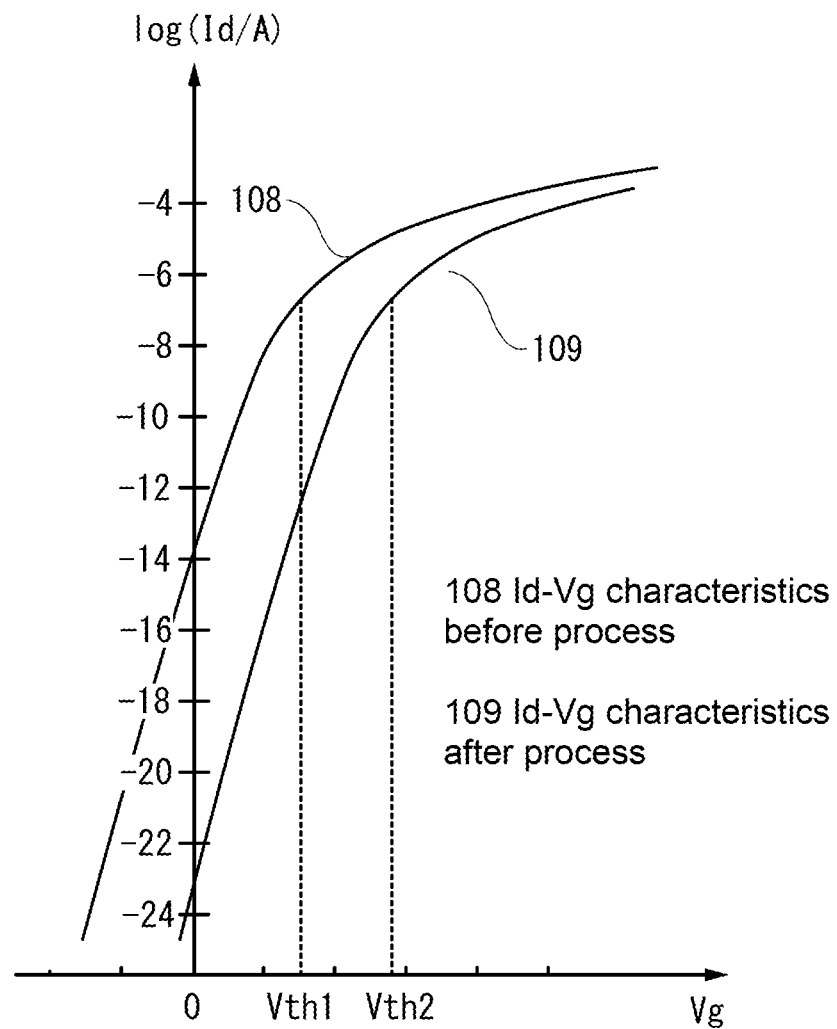
FIGS. 20A and 20B illustrate electrical characteristics of a transistor.

The threshold voltage of a semiconductor device is increased as shown in FIG. 20A by the trap of electrons in the electron trap layer 102. In particular, when the semiconductor layer 101 is formed using a wide band gap material, source-drain current (Icut current) when the potential of the gate electrode 103 is equal to the potential of the source electrode or the drain electrode can be significantly decreased.

For example, the Icut density (a current value per micrometer of a channel width) of an In—Ga—Zn-based oxide whose band gap is 3.2 eV is 1 zA/µm ($1 \times 10^{-21}$ A/µm) or less; 1 yA/µm ($1 \times 10^{-24}$ A/µm) or less, as a typical example.

FIG. 20A schematically shows dependence of current per micrometer of channel width ($I_d$) between source and drain electrodes on the potential of the gate electrode 103 ($V_g$) at room temperature, before and after electron trap in the electron trap layer 102. Note that each potential of the source electrode and the gate electrode 103 is 0 V and the potential of the drain electrode is +1 V. Although current lower than 1 fA cannot be measured directly, it can be estimated from a value, the subthreshold value, and the like measured by another method.

As indicated by a curve 108, the threshold voltage of the semiconductor device is $V_{th1}$ at first. After electron trapping, the threshold voltage increases (shifts in the positive direction) to become $V_{th2}$. As a result, the current density when $V_g=0$ becomes 1 aA/µm ($1 \times 10^{-18}$ A/µm) or less, for example, greater than or equal to 1 zA/µm and less than or equal to 1 yA/µm.

Figure 20B:
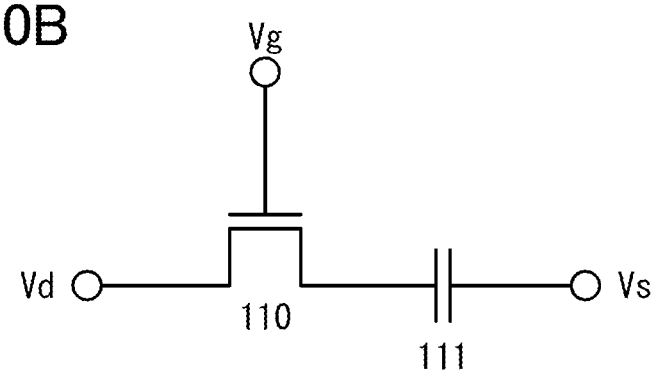

FIG. 20B illustrates a circuit in which charge stored in a capacitor 111 is controlled by a transistor 110. Leakage current between electrodes of the capacitor 111 is ignored here. The capacitance of the capacitor 111 is 1 fF, the potential of the capacitor 111 on the transistor 110 side is +1 V, and the potential of $V_d$ is 0 V.

The curve 108 in FIG. 20A denotes the $I_d$-$V_g$ characteristics of the transistor 110. When the channel width is 0.1 µm, the Icut density is approximately 1 fA and the resistivity of the transistor 110 at this time is approximately $1 \times 10^{15} \Omega$. Accordingly, the time constant of a circuit composed of the transistor 110 and the capacitor 111 is approximately one second. This means that most of the charge stored in the capacitor 111 is lost in approximately one second.

A curve 109 in FIG. 20A denotes the $I_d$-$V_g$ characteristics of the transistor 110. When the channel width is 0.1 µm, the Icut density is approximately 1 yA and the resistivity of the transistor 110 at this time is approximately $1 \times 10^{24} \Omega$. Accordingly, the time constant of the circuit composed of the transistor 110 and the capacitor 111 is approximately $1 \times 10^9$ seconds (=approximately 31 years). This means that one-third of the charge stored in the capacitor 111 is left after 10 years.

From this, charge can be held for 10 years in a simple circuit composed of a transistor and a capacitor without applying such a large voltage. This can be applied to various kinds of memory devices, such as a memory cell illustrated in FIG. 23 described later.

As the semiconductor layer 101, it is effective to use a layer whose hole effective mass is extremely large or substantially localized such as an intrinsic or substantially intrinsic oxide semiconductor film. In this case, hole injection from the semiconductor layer 101 to the electron trap layer 102 does not occur and consequently a phenomenon in which electrons trapped by the electron trap states 106 bond to holes and disappear does not occur. Accordingly, the charge retention characteristics can be improved.

For the gate electrode 410, a conductive film formed using Al, Ti, Cr, Co, Ni, Cu, Y, Zr, Mo, Ru, Ag, Ta, W, or the like can be used. The gate electrode may be a stack of any of the above materials. Alternatively, a conductive film containing nitrogen may be used for the gate electrode 410.

The oxide insulating film 412 may be formed over the gate insulating film 408 and the gate electrode 410. The oxide insulating film can be formed using an insulating film containing one or more of aluminum oxide, magnesium oxide, silicon oxide, silicon oxynitride, silicon nitride, gallium oxide, germanium oxide, yttrium oxide, zirconium oxide, lanthanum oxide, neodymium oxide, hafnium oxide, and tantalum oxide. The oxide insulating film may have a stacked structure of any of the above materials.

The oxide insulating film 412 is preferably formed using an oxide insulating film containing excess oxygen. An oxide insulating film containing excess oxygen refers to an oxide insulating film from which oxygen can be released by heat treatment or the like. A film in which the amount of released oxygen when converted into oxygen atoms is $1.0 \times 10^{19}$ atoms/cm$^3$ or more in thermal desorption spectroscopy analysis is preferable. Note that the substrate temperature in the thermal desorption spectroscopy analysis is preferably higher than or equal to 100° C. and lower than or equal to 700° C., or higher than or equal to 100° C. and lower than or equal to 500° C. Oxygen released from the oxide insulating film can be diffused to the channel formation region in the multilayer film 404 through the gate insulating film 408, so that oxygen vacancies formed in the channel formation region can be filled with the oxygen. As a result, stable electrical characteristics of the transistor can be achieved.

High integration of a semiconductor device requires miniaturization of a transistor. However, it is known that miniaturization of a transistor causes deterioration of the electrical characteristics of the transistor. In particular, a decrease in on-state current, which is directly caused by a decrease in channel width, is significant.

However, in the transistor of one embodiment of the present invention, as described above, the third oxide semiconductor film 404c is formed over a region where the channel is formed in the second oxide semiconductor film 404b, and a region where a channel formation layer and the gate insulating film are in contact with each other is small. Accordingly, scattering of carriers at the interface between the channel formation layer and the gate insulating film can be reduced and the field-effect mobility of the transistor can be increased.

In the case where an oxide semiconductor film is an intrinsic or substantially intrinsic oxide semiconductor film, it is concerned that the field-effect mobility is decreased because of a reduction in the number of carriers in the oxide semiconductor film. However, in the transistor of one embodiment of the present invention, a gate electric field is applied to the oxide semiconductor film not only in the vertical direction but also in the side surface directions. That is, the gate electric field is applied to the whole of the oxide semiconductor film, whereby current flows in the bulk of the oxide semiconductor film. Consequently, it is possible to improve the field-effect mobility of a transistor and suppress variations in electrical characteristics of the transistor due to a highly purified intrinsic oxide semiconductor film.

In the transistor of one embodiment of the present invention, the second oxide semiconductor film 404b is formed over the first oxide semiconductor film 404a, so that an interface state is less likely to be formed. In addition, impurities do not enter the second oxide semiconductor film 404b from above and below because the second oxide semiconductor film 404b is an intermediate layer in a three-layer structure. With the structure in which the second oxide semiconductor film 404b is electrically surrounded by an electric field from the gate electrode 410, on-state current of the transistor is increased as described above, and in addition, threshold voltage can be stabilized and an S value can be reduced. Thus, Icut (drain current when gate voltage is 0 V) can be reduced and power consumption can be reduced. Moreover, the threshold voltage of the transistor becomes stable; thus, long-term reliability of the semiconductor device can be improved.

Figure 3A:
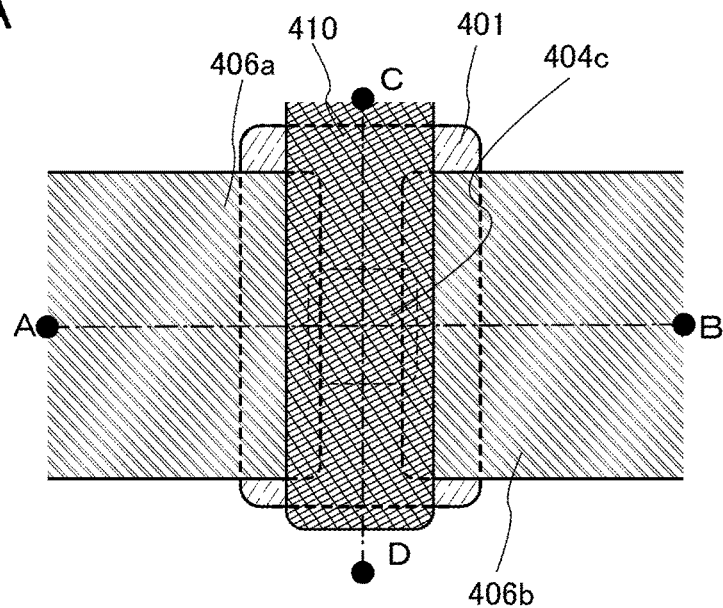
FIGS. 3A to 3C are a top view and cross-sectional views illustrating a transistor.
Figure 3B:
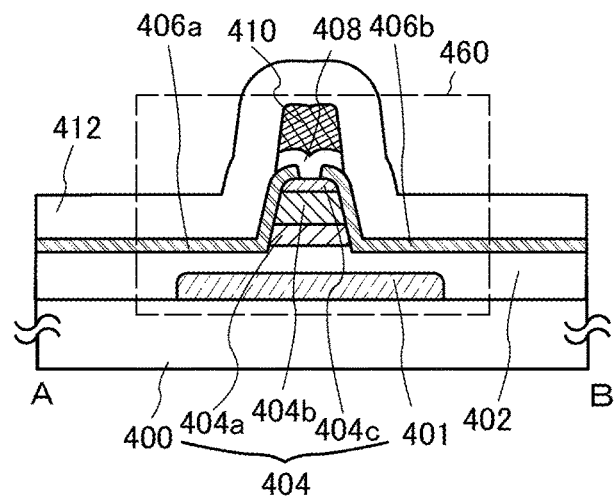
Figure 3C:
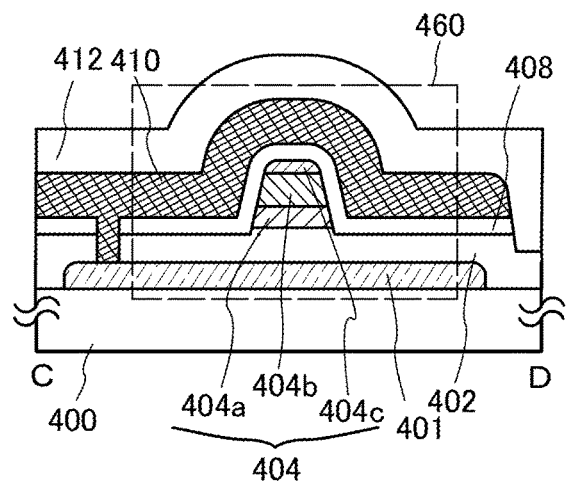

A transistor 460 illustrated in FIGS. 3A to 3C can be used. FIGS. 3A to 3C are a top view and cross-sectional views illustrating the transistor 460. FIG. 3A is the top view. FIG. 3B illustrates a cross section taken along dashed-dotted line A-B in FIG. 3A. FIG. 3C illustrates a cross section taken along dashed-dotted line C-D in FIG. 3A. Note that for simplification of the drawing, some components are not illustrated in the top view in FIG. 3A.

In the transistor 460 shown in FIGS. 3A to 3C, a conductive film 401 is provided between the base insulating film 402 and the substrate 400. When the conductive film 401 is used as a second gate electrode, the on-state current can be further increased or the threshold voltage can be controlled. In order to increase the on-state current, for example, as shown in FIGS. 3A to 3C, the gate electrode 410 and the conductive film 401 are electrically connected to each other to have the same potential, and the transistor is driven as a dual-gate transistor. Alternatively, to control the threshold voltage, the gate electrode 410 and the conductive film 401 are not electrically connected to each other, so that a fixed potential, which is different from a potential of the gate electrode 410, is supplied to the conductive film 401.

Figure 4A:
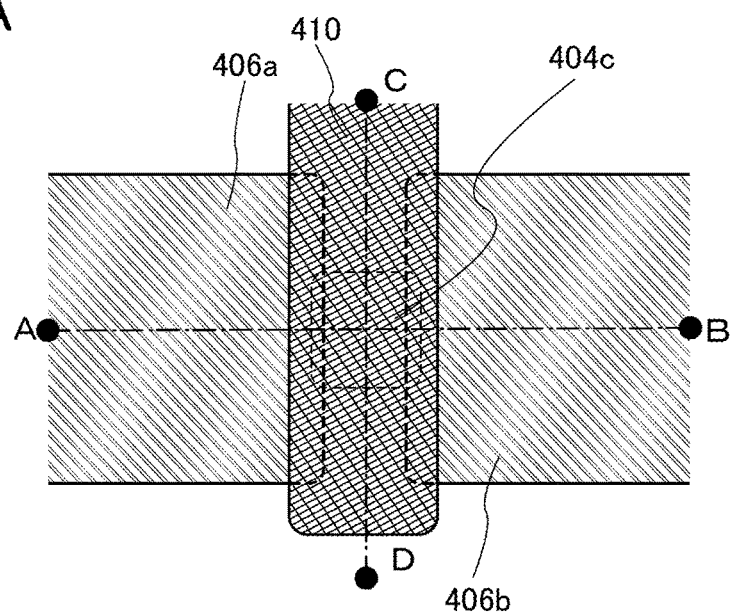
FIGS. 4A to 4C are a top view and cross-sectional views illustrating a transistor.
Figure 4B:
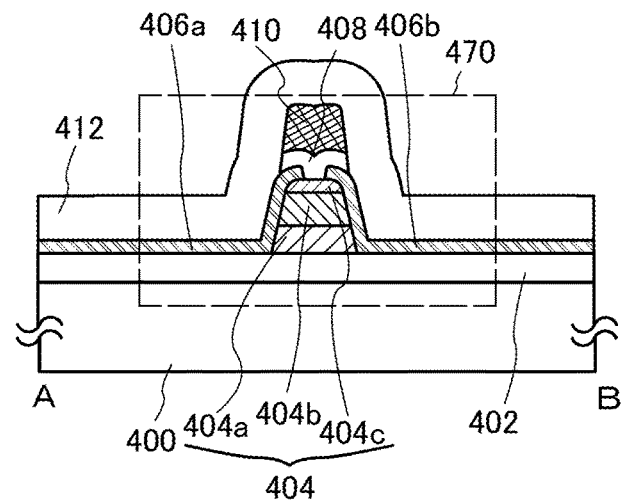
Figure 4C:
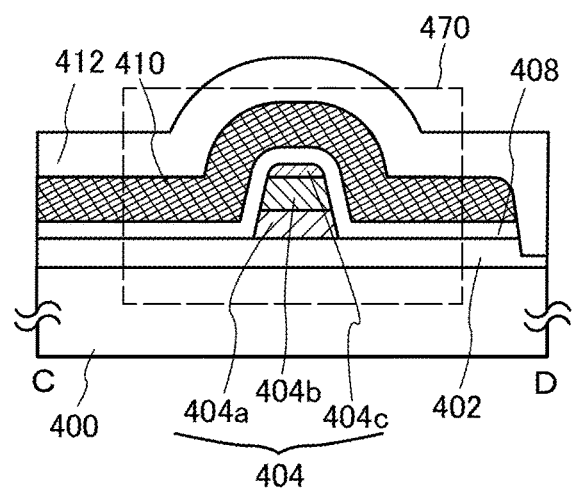

A transistor 470 illustrated in FIGS. 4A to 4C can be used. FIGS. 4A to 4C are a top view and cross-sectional views illustrating the transistor 470. FIG. 4A is the top view. FIG. 4B illustrates a cross section taken along dashed-dotted line A-B in FIG. 4A. FIG. 4C illustrates a cross section taken along dashed-dotted line C-D in FIG. 4A. Note that for simplification of the drawing, some components are not illustrated in the top view in FIG. 4A.

In the transistor 470, the base insulating film 402 is not etched when the first oxide semiconductor film 404a, the second oxide semiconductor film 404b, and the third oxide semiconductor film 404c are formed; thus, the base insulating film 402 is not etched.

In order to prevent etching of the base insulating film 402 caused by overetching, the selectivity ratio of the oxide semiconductor film with respect to the base insulating film 402 is set high.

Note that the conductive film 401 may be provided in FIGS. 4A to 4C as in FIGS. 3A to 3C.

Figure 5A:
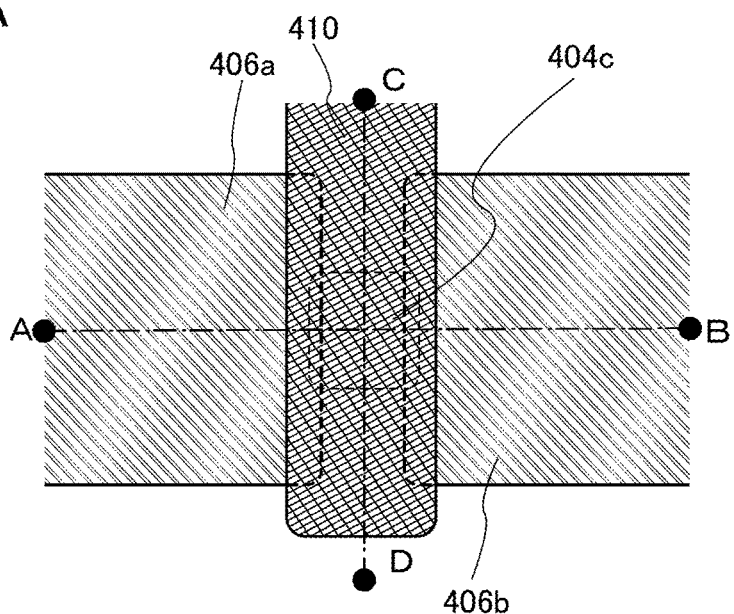
FIGS. 5A to 5C are a top view and cross-sectional views illustrating a transistor.
Figure 5B:
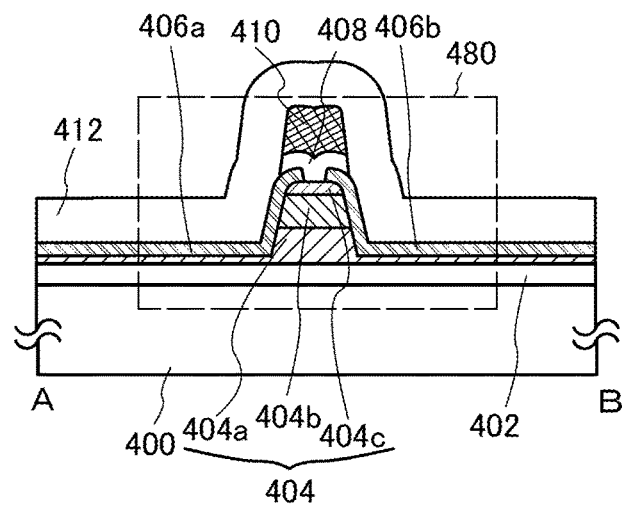
Figure 5C:
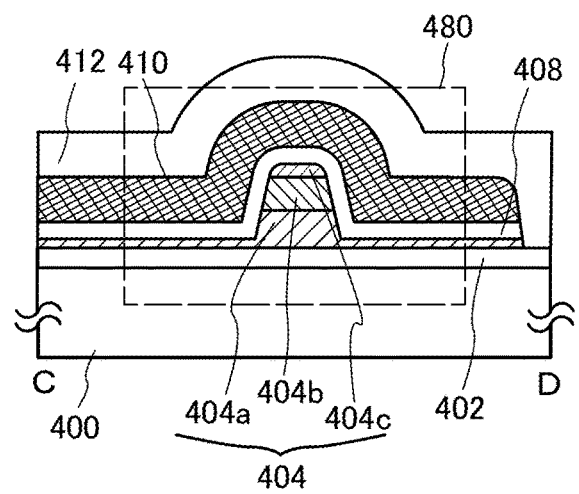

A transistor 480 illustrated in FIGS. 5A to 5C can be used. FIGS. 5A to 5C are a top view and cross-sectional views illustrating the transistor 480. FIG. 5A is the top view. FIG. 5B illustrates a cross section taken along dashed-dotted line A-B in FIG. 5A. FIG. 5C illustrates a cross section taken along dashed-dotted line C-D in FIG. 5A. Note that for simplification of the drawing, some components are not illustrated in the top view of FIG. 5A.

In etching to form the first oxide semiconductor film 404a, the second oxide semiconductor film 404b, and the third oxide semiconductor film 404c of the transistor 480, the first oxide semiconductor film is not entirely etched, so that the first oxide semiconductor film has a projected shape.

Note that the conductive film 401 may be provided in FIGS. 5A to 5C as in FIGS. 3A to 3C.

In this embodiment, the second oxide semiconductor film is sandwiched between the first oxide semiconductor film and the third oxide semiconductor film. However, the structure is not limited thereto; a structure without the first oxide semiconductor film or a structure with another oxide semiconductor film may be employed. For example, FIGS. 27A to 27C and FIGS. 28A to 28C each illustrate a structure without the first oxide semiconductor film 404a.

The electrode and the oxide semiconductor film may have angular end portions. In order to obtain the angular end portions, when a film is processed using a resist mask or a hard mask, the selectivity ratio of the film to be processed with respect to the resist mask or the hard mask is set high. A specific structure example (a transistor 490) will be described with reference to FIGS. 6A to 6C.

Figure 6A:
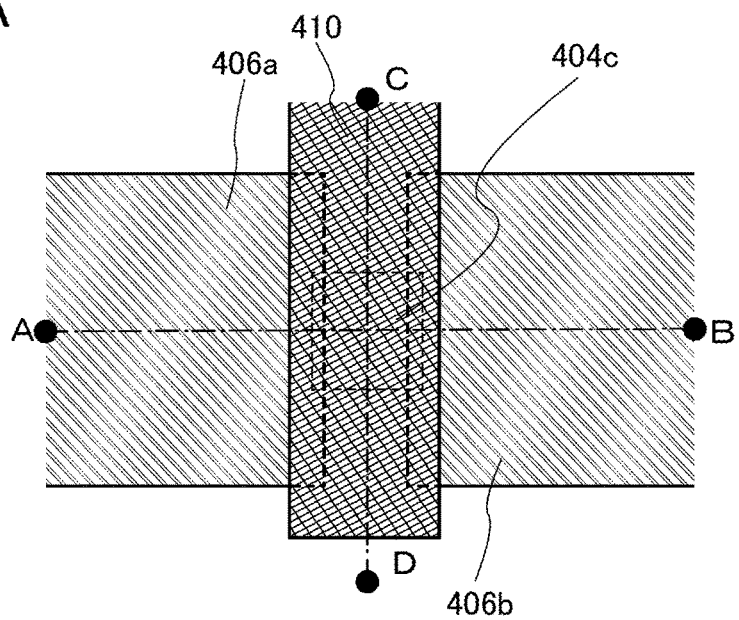
FIGS. 6A to 6C are a top view and cross-sectional views illustrating a transistor.
Figure 6B:
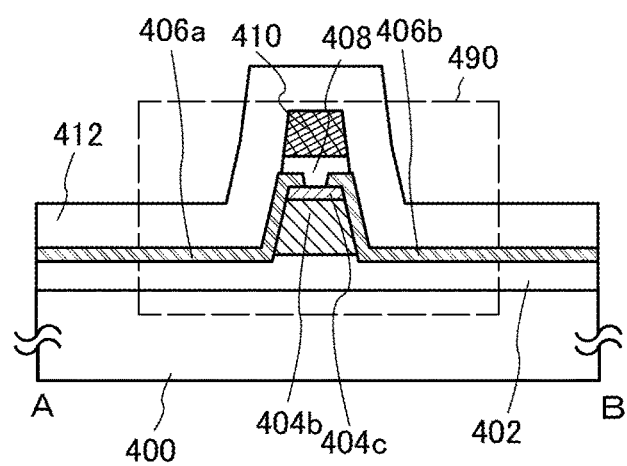
Figure 6C:
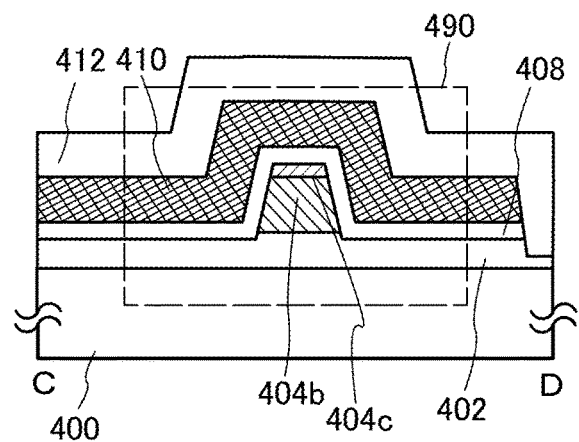

FIGS. 6A to 6C are a top view and cross-sectional views of the transistor 490. FIG. 6B illustrates a cross section taken along dashed-dotted line A-B in FIG. 6A. FIG. 6C illustrates a cross section taken along dashed-dotted line C-D in FIG. 6A. Note that for simplification of the drawing, some components are not illustrated in the top view of FIG. 6A.

In the transistor 490, only the second oxide semiconductor film 404b and the third oxide semiconductor film 404c are electrically surrounded by an electric field from the gate electrode.

Note that the conductive film 401 may be provided in FIGS. 6A to 6C as in FIGS. 3A to 3C.

This embodiment can be combined with any of the other embodiments in this specification as appropriate.

Embodiment 2

In this embodiment, a method for manufacturing the transistor 450 described in Embodiment 1 with reference to FIGS. 1A to 1C will be described with reference to FIGS. 7A to 7C and FIGS. 8A to 8C.

Figure 7A:
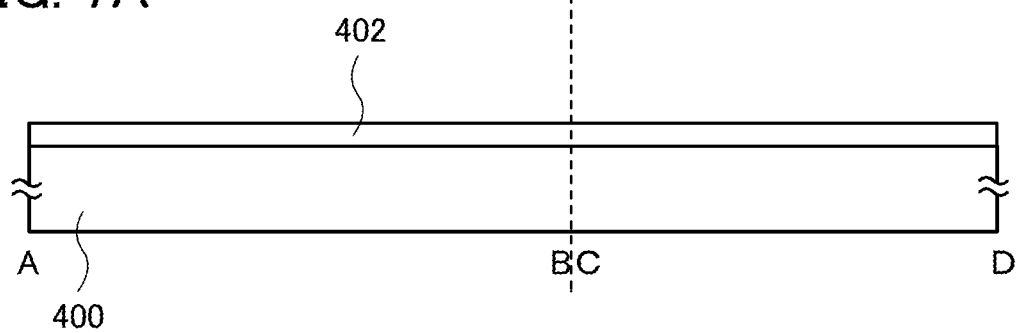
FIGS. 7A to 7C illustrate a method for manufacturing a transistor.

First, the base insulating film 402 is formed over the substrate 400 (see FIG. 7A).

As the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used. Further alternatively, any of these substrates further provided with a semiconductor element may be used.

The base insulating film 402 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a film may be formed by mixing the above materials, and at least an upper layer of the base insulating film 402 which is in contact with the multilayer film 404 is preferably formed using a material containing excess oxygen that might serve as a supply source of oxygen to the multilayer film 404.

Oxygen may be added to the base insulating film 402 by an ion implantation method, an ion doping method, a plasma immersion ion implantation method, or the like. Adding oxygen enables the base insulating film 402 to supply oxygen much easily to the multilayer film 404.

In the case where a surface of the substrate 400 is made of an insulator and there is no influence of impurity diffusion to the multilayer film 404 to be formed later, the base insulating film 402 is not necessarily provided.

Figure 7B:
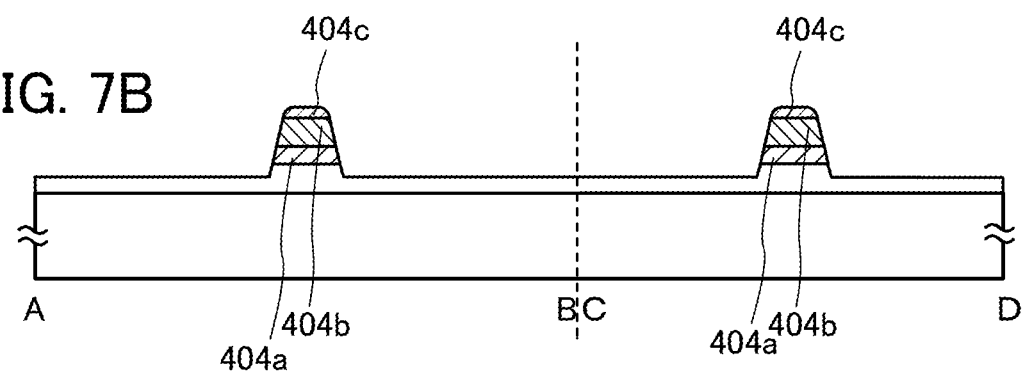

Next, the first oxide semiconductor film 404a, the second oxide semiconductor film 404b, and the third oxide semiconductor film 404c are formed over the base insulating film 402 by a sputtering method, a CVD method, an MBE method, an ALD method, or a PLD method (see FIG. 7B). At this time, as shown in the drawing, the base insulating film 402 can be slightly overetched. By overetching of the base insulating film 402, the gate electrode 410 to be formed later can cover the multilayer film 404 easily.

For processing the first oxide semiconductor film 404a, the second oxide semiconductor film 404b, and the third oxide semiconductor film 404c into island shapes, first, a film to be a hard mask (e.g., a tungsten film) and a resist mask are provided over the third oxide semiconductor film 404c, and the film to be a hard mask is etched to form a hard mask. Then, the resist mask is removed and the first oxide semiconductor film 404a, the second oxide semiconductor film 404b, and the third oxide semiconductor film 404c are etched by using the hard mask as a mask. After that, the hard mask is removed. At the time of the etching, end portions of the hard mask are gradually reduced as the etching progresses; as a result, the end portions of the hard mask may be rounded to have curved surfaces. Accordingly, end portions of the third oxide semiconductor film 404c may also be rounded to have curved surfaces. With this structure, the coverage with the gate insulating film 408, the gate electrode 410, and the oxide insulating film 412, which are to be formed over the third oxide semiconductor film 404c, can be improved; thus, a shape defect such as disconnection can be inhibited. In addition, electric field concentration which might occur at end portions of the source electrode 406a and the drain electrode 406b can be reduced, which can suppress deterioration of the transistor.

Figure 9A:
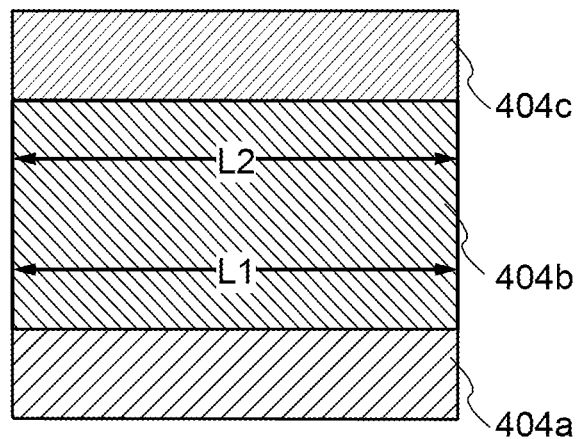
FIGS. 9A to 9C illustrate shapes of oxide semiconductor films.

The shapes of the oxide semiconductor films are described with reference to FIGS. 9A to 9C. FIG. 9A illustrates a stack including the first oxide semiconductor film 404a, the second oxide semiconductor film 404b, and the third oxide semiconductor film 404c. The length in the channel length direction of the bottom surface of the second oxide semiconductor film 404b is L1. The length in the channel length direction of the top surface of the second oxide semiconductor film 404b is L2.

Figure 9B:
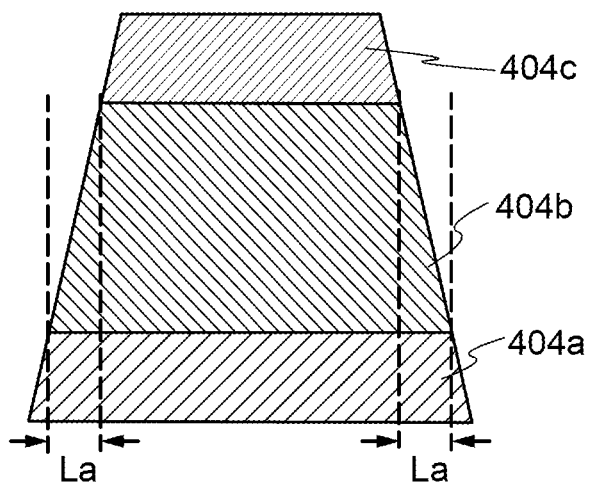
Figure 9C:
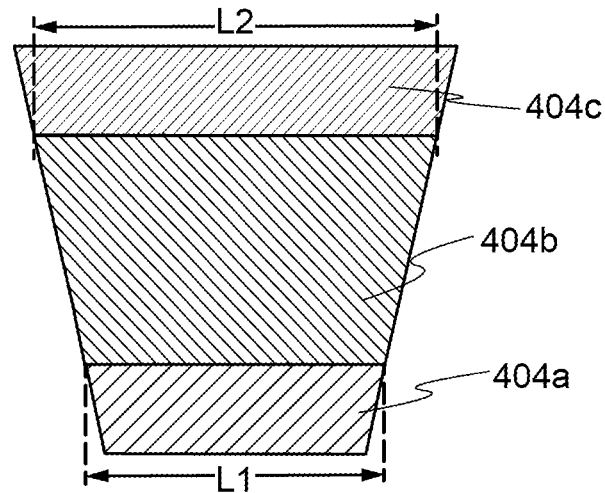

After etching of the stack in FIG. 9A, the stack including the oxide semiconductor films has what is called a forward tapered shape as illustrated in FIG. 9B in which the distance between the ends becomes shorter toward the top surface (L1>L2). The stack including the oxide semiconductor films may have what is called a reverse tapered shape as illustrated in FIG. 9C in which the distance between the ends becomes longer toward the top surface (L1<L2).

Half the difference between L1 and L2 shown in FIG. 9B is La. It is preferable that La be greater than 0 and less than half of L2 (0<La<L2/2). In FIG. 9C, L1 is greater than 0 (0<L1).

The stack preferably has a forward tapered shape in consideration of coverage with a film which is to be stacked thereon (e.g., the gate insulating film 408).

In order to form a continuous energy band in a stack including the first oxide semiconductor film 404a, the second oxide semiconductor film 404b, the third oxide semiconductor film 404c, the layers need to be formed successively without exposure to the air with the use of a multichamber deposition apparatus (e.g., a sputtering apparatus) including a load lock chamber. It is preferable that each chamber of the sputtering apparatus be able to be evacuated to a high vacuum (to approximately $5 \times 10^{-7}$ Pa to $1 \times 10^4$ Pa) by an adsorption vacuum evacuation pump such as a cryopump and that the chamber be able to heat a substrate over which a film is to be deposited to 100° C. or higher, preferably 500° C. or higher, so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an evacuation system into the chamber.

Not only high vacuum evacuation of the chamber but also high purity of a sputtering gas is necessary to obtain a highly purified intrinsic oxide semiconductor. When a highly purified gas having a dew point of −40° C. or lower, preferably −80° C. or lower, further preferably −100° C. or lower is used as an oxygen gas or an argon gas used as a sputtering gas, moisture or the like can be prevented from entering an oxide semiconductor as much as possible. The state in which impurity concentration is low and density of defect states is low (the number of oxygen vacancies is small) is referred to as "highly purified intrinsic" or "substantially highly purified intrinsic".

The materials described in Embodiment 1 can be used for the first oxide semiconductor film 404a, the second oxide semiconductor film 404b, and the third oxide semiconductor film 404c. For example, an In—Ga—Zn oxide whose atomic ratio of In to Ga and Zn is 1:3:4 or 1:3:2 can be used for the first oxide semiconductor film 404a, an In—Ga—Zn oxide whose atomic ratio of In to Ga and Zn is 1:1:1 can be used for the second oxide semiconductor film 404b, and an In—Ga—Zn oxide whose atomic ratio of In to Ga and Zn is 1:3:4 or 1:3:2 can be used for the third oxide semiconductor film 404c.

An oxide semiconductor that can be used for each of the first oxide semiconductor film 404a, the second oxide semiconductor film 404b, and the third oxide semiconductor film 404c preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and/or Zn.

Examples of a stabilizer include gallium (Ga), tin (Sn), hafnium (Hf), aluminum (Al), and zirconium (Zr). Other examples of a stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

Alternatively, a material represented by $InMO_3(ZnO)_m$ (m>0, where m is not an integer) may be used. Note that M represents one or more metal elements selected from Ga, Fe, Mn, and Co. Further alternatively, a material represented by $In_2SnO_5(ZnO)_n$ (n>0, where n is an integer) may be used.

Note that as described in Embodiment 1 in detail, materials are selected so that the first oxide semiconductor film 404a and the third oxide semiconductor film 404c each have an electron affinity lower than that of the second oxide semiconductor film 404b.

Note that the oxide semiconductor films are each preferably deposited by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

When In—Ga—Zn oxide is used for the first to third oxide semiconductor films 404a to 404c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the first oxide semiconductor film 404a and the third oxide semiconductor film 404c each have an electron affinity lower than that of the second oxide semiconductor film 404b.

Note that in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \le r^2$, and r may be 0.05, for example. The same applies to other oxides.

The indium content in the second oxide semiconductor film 404b is preferably higher than the indium content in the first oxide semiconductor film 404a and the indium content in the third oxide semiconductor film 404c. In an oxide semiconductor, the s orbital of heavy metal mainly contributes to carrier transfer, and when the proportion of In in the oxide semiconductor is increased, overlap of the s orbitals is likely to be increased. Thus, an oxide having a composition in which the proportion of In is higher than that of Ga has higher mobility than an oxide having a composition in which the proportion of In is equal to or lower than that of Ga. For this reason, with use of an oxide having a high indium content for the second oxide semiconductor film 404b, a transistor having high mobility can be achieved.

Here, a structure of an oxide semiconductor film will be described below.

In this specification, a term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is an oxide semiconductor film including a plurality of crystal parts. Most of the crystal parts each fit inside a cube whose one side is less than 100 nm. Thus, the CAAC-OS film may include a crystal part that fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is unlikely to occur.

In the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In the TEM image of the CAAC-OS film observed in a direction substantially perpendicular to the sample surface (plan-view TEM image), metal atoms are arranged in a triangular or hexagonal configuration in the crystal parts. However, there is no regularity in arrangement of metal atoms between different crystal parts.

From the cross-sectional TEM image and the plan-view TEM image, orientation characteristics are found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is assigned to the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is assigned to the (110) plane of the $InGaZnO_4$ crystal. Analysis (φ scan) is performed under conditions where the sample is rotated around a normal vector of the sample surface as an axis (φ axis) with 2θ fixed at around 56°. When the sample is a single-crystal oxide semiconductor film of $InGaZnO_4$, six peaks appear. The six peaks are assigned to crystal planes equivalent to the (110) plane. In contrast, when the sample is the CAAC-OS layer, a peak is not clearly observed.

The above results mean that in the CAAC-OS film having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is oriented in a direction parallel to a normal vector of a formation surface or a normal vector of a top surface. Thus, for example, when the shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, if crystal growth leading to the CAAC-OS film occurs from the vicinity of the top surface of the film, the degree of the crystallinity in the vicinity of the top surface may be higher than that in the vicinity of the formation surface. Moreover, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak may be observed at 2θ of around 36°, in addition to the peak that appears at 2θ of around 31°. The peak that appears at 2θ of around 36° indicates that a crystal having no c-axis alignment is included in part of the CAAC-OS film. It is preferable that a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity if contained in the oxide semiconductor film. Note that the impurity contained in the oxide semiconductor film might serve as a carrier trap or a carrier generation source.

The CAAC-OS film is an oxide semiconductor film having a low density of defect states. Oxygen vacancies in the oxide semiconductor film may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and thus may behave like fixed electric charge. Accordingly, the transistor which includes the oxide semiconductor film having high impurity concentration and a high density of defect states can have unstable electrical characteristics.

In a transistor using the CAAC-OS film, change in electrical characteristics due to irradiation with visible light or ultraviolet light is small.

Next, a microcrystalline oxide semiconductor film will be described.

In a TEM image, crystal parts cannot be found clearly in the microcrystalline oxide semiconductor film in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a TEM image of the nc-OS film, for example, a crystal grain boundary cannot clearly found in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, the nc-OS film sometimes cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., greater than or equal to 50 nm) larger than the diameter of a crystal part. Meanwhile, spots are shown in a nanobeam electron diffraction pattern of the nc-OS film obtained by using an electron beam having a probe diameter (e.g., greater than or equal to 1 nm and smaller than or equal to 30 nm) close to, or smaller than or equal to a diameter of a crystal part. In a nanobeam electron diffraction pattern of the nc-OS film, regions with high luminance in a circular (ring) pattern may be shown, and a plurality of spots may be shown in the ring-like region.

The nc-OS film is an oxide semiconductor film that has high regularity as compared with an amorphous oxide semiconductor film. For this reason, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

For example, the CAAC-OS film can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The flat-plate-like sputtered particle or pellet-like sputtered particle is electrically charged and thus reaches the substrate while maintaining its crystal state, without being aggregation in plasma, forming a CAAC-OS film.

First heat treatment may be performed after the third oxide semiconductor film 404c is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the second oxide semiconductor film 404b can be improved, and in addition, impurities such as hydrogen and water can be removed from the base insulating film 402, the first oxide semiconductor film 404a, and the third oxide semiconductor film 404c. Note that the first heat treatment may be performed before etching for formation of the second oxide semiconductor film 404b.

Figure 7C:
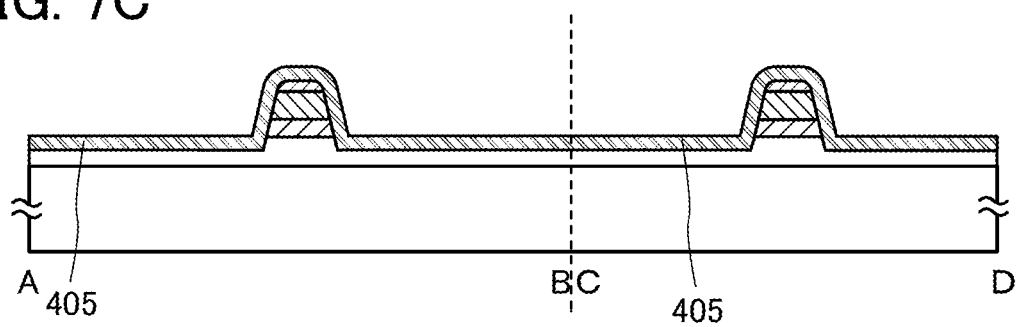

A first conductive film 405 to be the source electrode 406a and the drain electrode 406b is formed over the first oxide semiconductor film 404a, the second oxide semiconductor film 404b, and the third oxide semiconductor film 404c (see FIG. 7C). For the first conductive film 405, Al, Cr, Cu, Ta, Ti, Mo, W, or an alloy material containing any of these as its main component can be used. For example, a 100-nm-thick titanium film is formed by a sputtering method or the like. Alternatively, a tungsten film may be formed by a CVD method.

Figure 8A:
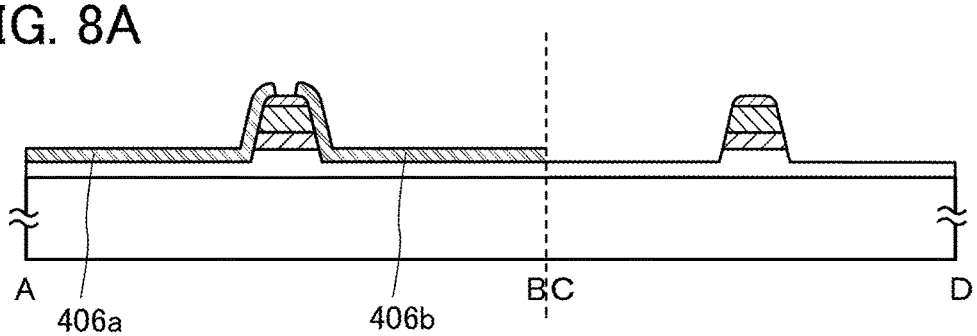
FIGS. 8A to 8C illustrate a method for manufacturing a transistor.

Then, the first conductive film 405 is divided by etching to form the source electrode 406a and the drain electrode 406b (see FIG. 8A). Note that because of the etching of the first conductive film 405, end portions of the source electrode 406a and the drain electrode 406b are rounded (have curved surfaces) in some cases. The base insulating film 402 may be further etched in the C-D direction than in the A-B direction by the etching of the first conductive film 405.

Figure 10:
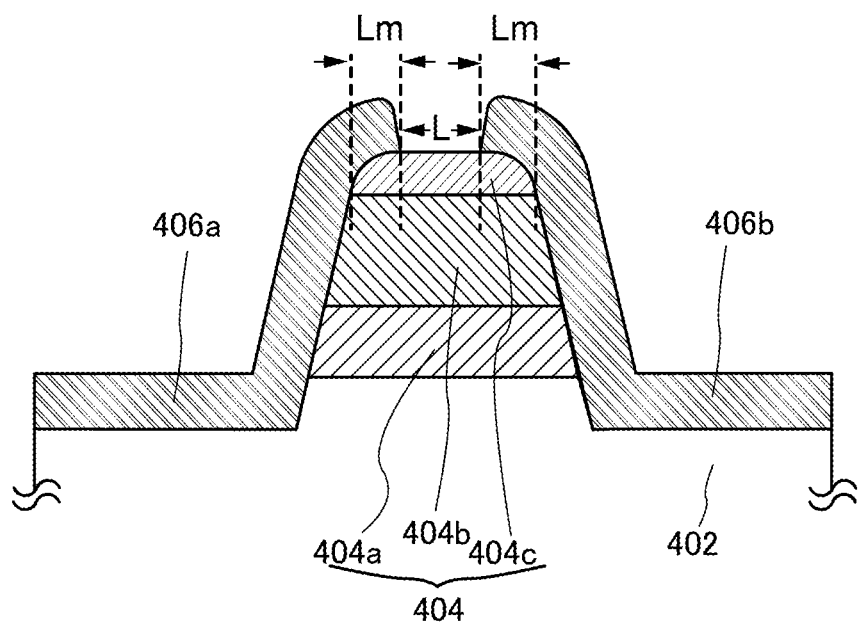
FIG. 10 illustrates a positional relationship between a multilayer film and a source electrode or a drain electrode.

Positional relationships of the multilayer film 404, the source electrode 406a, and the drain electrode 406b will be described with reference to FIG. 10.

In the transistor of this embodiment, a length Lm of a region where the source electrode 406a (or the drain electrode 406b) and the second oxide semiconductor film 404b of the multilayer film 404 overlap with each other is preferably less than twice a channel length L, further preferably greater than or equal to zero and less than half the channel length L.

Such a structure can relieve a high electric field generated around a drain region to prevent generation of hot carriers, and can prevent a decrease in on-state current. Parasitic capacitance in the region is increased when the length Lm is long; thus, the length Lm is set within the above range, so that an increase in parasitic capacitance and a decrease in on-state current can be suppressed.

Figure 8B:
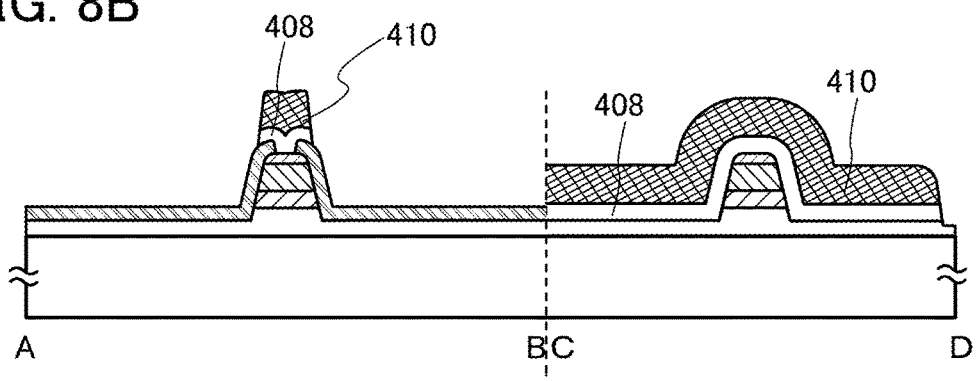

Next, the gate insulating film 408 is formed over the third oxide semiconductor film 404c, the source electrode 406a, and the drain electrode 406b, and the gate electrode 410 is formed over the gate insulating film 408 (see FIG. 8B). Note that the gate electrode 410 is formed so that an electric field from the gate electrode 410 electrically surrounds the second oxide semiconductor film 404b.

The gate insulating film 408 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 408 may have a stacked-layer structure of any of the above materials. The gate insulating film 408 can be formed by a sputtering method, a CVD method, an MBE method, an ALD method, a PLD method, or the like.

For the gate electrode 410, Al, Ti, Cr, Co, Ni, Cu, Y, Zr, Mo, Ru, Ag, Ta, W, or an alloy material containing any of these as its main component can be used. The gate electrode 410 can be formed by a sputtering method, a CVD method, or the like. The gate electrode 410 may be formed using a conductive film containing nitrogen or a stack including the conductive film and a conductive film containing nitrogen.

The gate insulating film 408 and the gate electrode 410 may be formed in the following manner: an insulating film to be the gate insulating film 408 and a conductive film to be the gate electrode 410 are formed by a CVD method, the conductive film to be the gate electrode 410 is selectively etched to form the gate electrode 410, and the gate insulating film 408 is formed using the gate electrode 410 as a mask. In this manner, the insulating film to be the gate insulating film 408 and the conductive film to be the gate electrode 410 can be successively formed.

Figure 8C:
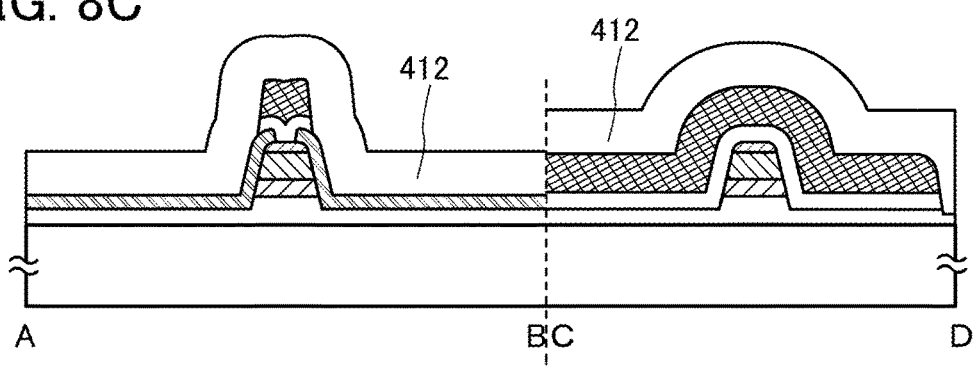

Next, the oxide insulating film 412 is formed over the source and drain electrodes 406a and 406b, the gate insulating film 408, and the gate electrode 410 (see FIG. 8C). A material and a method for the oxide insulating film 412 can be similar to those of the base insulating film 402. The oxide insulating film 412 may be formed using aluminum oxide, magnesium oxide, silicon oxide, gallium oxide, germanium oxide, yttrium oxide, zirconium oxide, lanthanum oxide, neodymium oxide, hafnium oxide, tantalum oxide, or an oxide insulating material containing nitrogen. The oxide insulating film 412 can be formed by a sputtering method, a CVD method, an MBE method, an ALD method, or a PLD method, and is preferably formed to contain excess oxygen so as to be able to supply oxygen to the multilayer film 404.

Oxygen may be added to the oxide insulating film 412 by an ion implantation method, an ion doping method, a plasma immersion ion implantation method, or the like. Adding oxygen enables the oxide insulating film 412 to supply oxygen much easily to the multilayer film 404.

Then, second heat treatment may be performed. The second heat treatment can be performed under a condition similar to that of the first heat treatment. By the second heat treatment, excess oxygen is easily released from the base insulating film 402, the gate insulating film 408, and the oxide insulating film 412, so that oxygen vacancies in the multilayer film 404 can be reduced.

Through the above process, the transistor 450 illustrated in FIGS. 1A to 1C can be fabricated.

This embodiment can be combined with any of the other embodiments in this specification as appropriate.

Embodiment 3

In this embodiment, a transistor having a structure different from that of the transistor described in the above embodiments will be described.

Figure 11A:
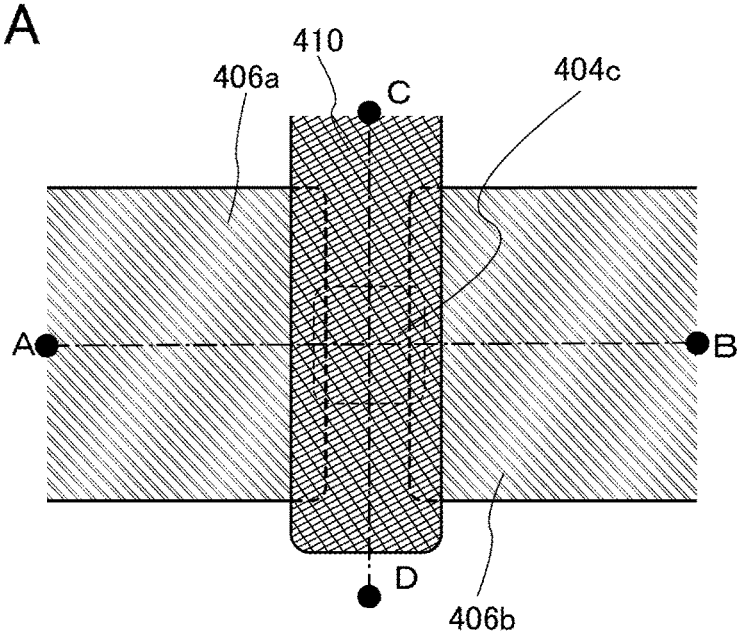
FIGS. 11A to 11C are a top view and cross-sectional views illustrating a transistor.
Figure 11B:
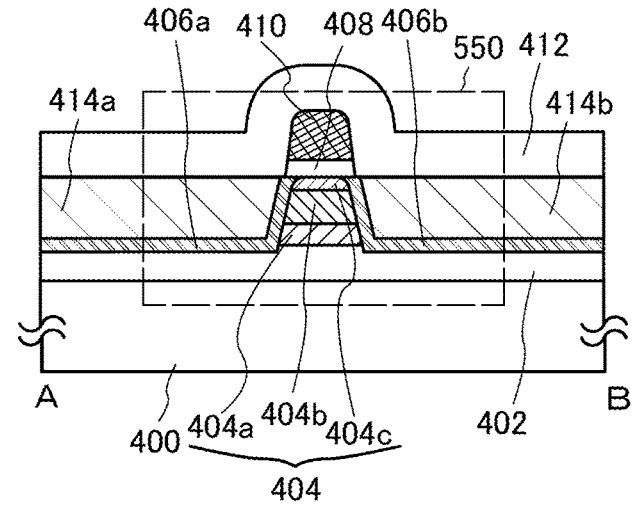
Figure 11C:
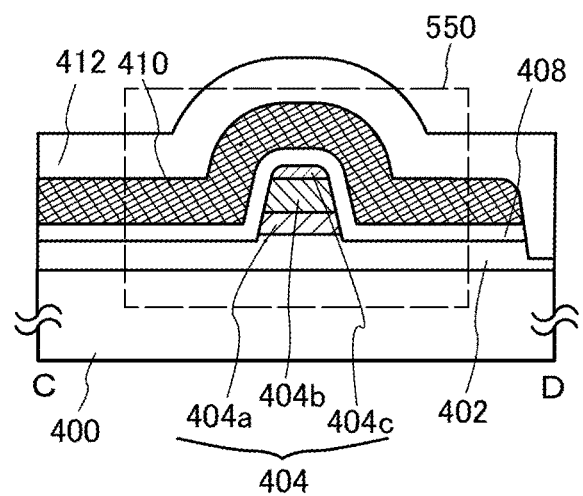

FIGS. 11A to 11C are a top view and cross-sectional views illustrating a transistor of one embodiment of the present invention. FIG. 11A is the top view. FIG. 11B illustrates a cross section taken along dashed-dotted line A-B in FIG. 11A. FIG. 11C illustrates a cross section taken along dashed-dotted line C-D in FIG. 11A. Note that for simplification of the drawing, some components in the top view in FIG. 11A are not illustrated. In some cases, the direction of the dashed-dotted line A-B is referred to as a channel length direction, and the direction of the dashed-dotted line C-D is referred to as a channel width direction.

A transistor 550 illustrated in FIGS. 11A to 11C includes the base insulating film 402 having the depressed portion and the projected portion over the substrate 400; the first oxide semiconductor film 404a, the second oxide semiconductor film 404b, and the third oxide semiconductor film 404c over the projected portion of the base insulating film 402; the source electrode 406a and the drain electrode 406b each in contact with the side surfaces of the first oxide semiconductor film 404a, the second oxide semiconductor film 404b, and the third oxide semiconductor film 404c; an insulating film 414a over the source electrode 406a and an insulating film 414b over the drain electrode 406b; the gate insulating film 408 over the third oxide semiconductor film 404c, the source electrode 406a, and the drain electrode 406b; the gate electrode 410 which is on and in contact with the gate insulating film 408 and faces the top surface and the side surface of the second oxide semiconductor film 404b; and the oxide insulating film 412 over the source electrode 406a, the drain electrode 406b, and the gate electrode 410. The first oxide semiconductor film 404a, the second oxide semiconductor film 404b, and the third oxide semiconductor film 404c are collectively referred to as the multilayer film 404.

Note that a channel length means a distance between a source (a source region or a source electrode) and a drain (a drain region or a drain electrode) in a region where a semiconductor film and a gate electrode overlap with each other in a top view. Accordingly, in FIG. 11A, the channel length is a distance between the source electrode 406a and the drain electrode 406b in a region where the second oxide semiconductor film 404b and the gate electrode 410 overlap with each other. A channel width means a length of a region where a source faces parallel to a drain and where a semiconductor film and a gate electrode overlap with each other. Accordingly, in FIG. 11A, the channel width is a length of a region where the source electrode 406a and the drain electrode 406b face each other and where the second oxide semiconductor film 404b and the gate electrode 410 overlap with each other.

In fabricating a transistor with a small channel length and a small channel width, an electrode, a semiconductor film, or the like is processed while a resist mask is reduced in size and consequently has a round upper end portion (curved surface) in some cases. With this structure, the coverage with the gate insulating film 408, the gate electrode 410, and the oxide insulating film 412, which are to be formed over the second oxide semiconductor film 404b, can be improved. In addition, electric field concentration which might occur at end portions of the source electrode 406a and the drain electrode 406b can be reduced, which can suppress deterioration of the transistor.

A high current can flow in the whole (bulk) of the second oxide semiconductor film 404b which is a channel because the side surfaces of the source electrode 406a and the drain electrode 406b are in contact with the side surfaces of the second oxide semiconductor film 404b, so that a high on-state current can be obtained.

Miniaturization of a transistor leads to high integration and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm. Even with such a small channel width, a transistor of one embodiment of the present invention can increase the on-state current by having the s-channel structure.

An electric field from the gate electrode 410 electrically surrounds the second oxide semiconductor film 404b, which increases on-state current. Note that in the s-channel structure, current flows in the whole of the second oxide semiconductor film 404b. When current flows in an inner part of the multilayer film 404 (the whole of the second oxide semiconductor film 404b), the current is hardly affected by interface scattering, leading to a high on-state current. Note that when the second oxide semiconductor film 404b is thick, the on-state current can be further increased. Furthermore, the gate electrode 410 extending lower than the interface between the first oxide semiconductor film 404a and the second oxide semiconductor film 404b toward the base insulating film 402 side does not affect the channel width. Thus, the channel width can be reduced, achieving high density (high integration).

Figure 12A:
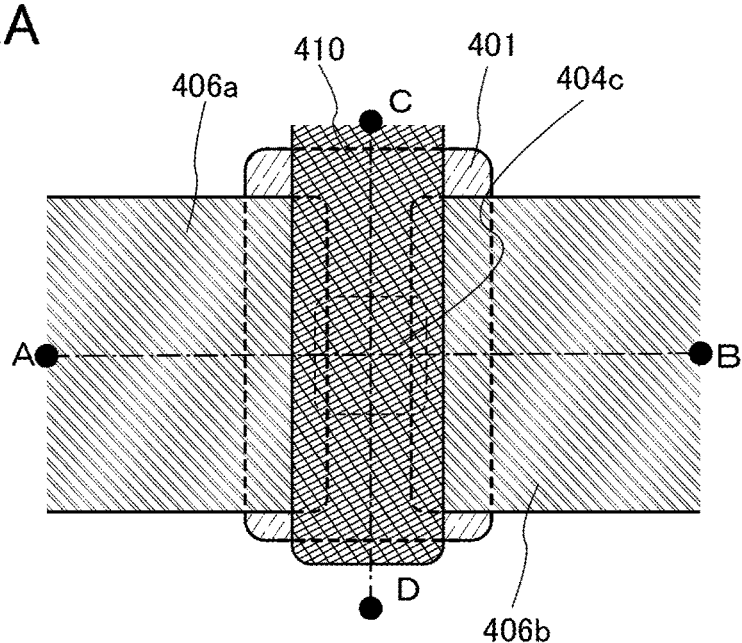
FIGS. 12A to 12C are a top view and cross-sectional views illustrating a transistor.
Figure 12B:
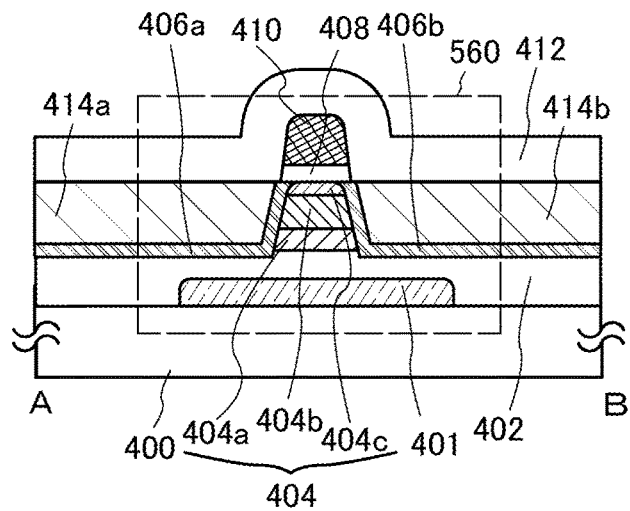
Figure 12C:
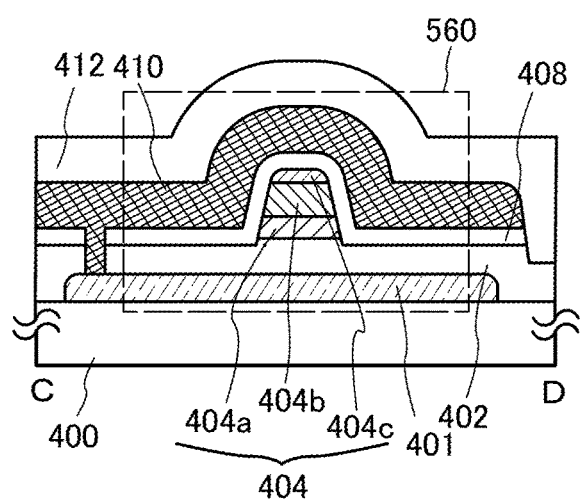

A transistor 560 illustrated in FIGS. 12A to 12C can be used. FIGS. 12A to 12C are a top view and cross-sectional views illustrating the transistor 560. FIG. 12A is the top view. FIG. 12B illustrates a cross section taken along dashed-dotted line A-B in FIG. 12A. FIG. 12C illustrates a cross section taken along dashed-dotted line C-D in FIG. 12A. Note that for simplification of the drawing, some components in the top view in FIG. 12A are not illustrated.

In the transistor 560 shown in FIGS. 12A to 12C, a conductive film 401 is provided between the base insulating film 402 and the substrate 400. When the conductive film 401 is used as a second gate electrode, the on-state current can be further increased or the threshold voltage can be controlled. In order to increase the on-state current, for example, as shown in FIGS. 12A to 12C, the gate electrode 410 and the conductive film 401 are electrically connected to each other to have the same potential, and the transistor is driven as a dual-gate transistor. Alternatively, to control the threshold voltage, the gate electrode 410 and the conductive film 401 are not electrically connected to each other, so that a fixed potential, which is different from a potential of the gate electrode 410, is supplied to the conductive film 401.

Figure 13A:
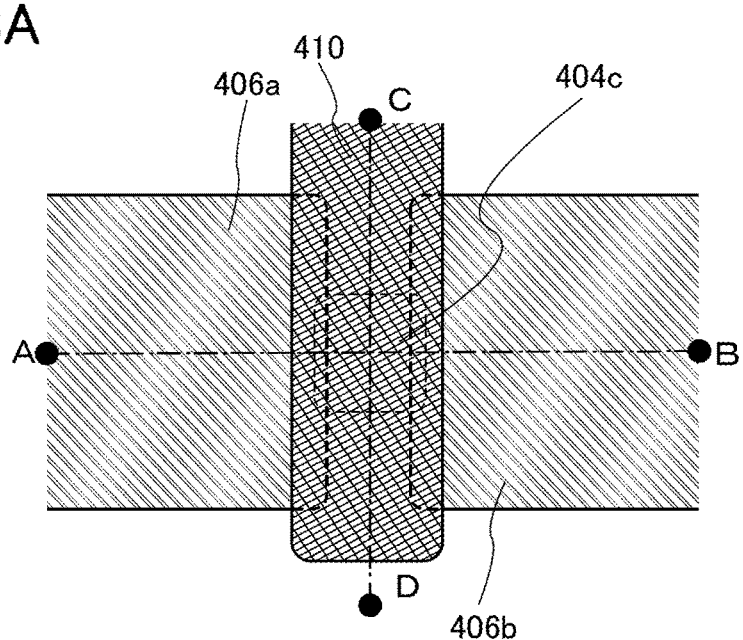
FIGS. 13A to 13C are a top view and cross-sectional views illustrating a transistor.
Figure 13B:
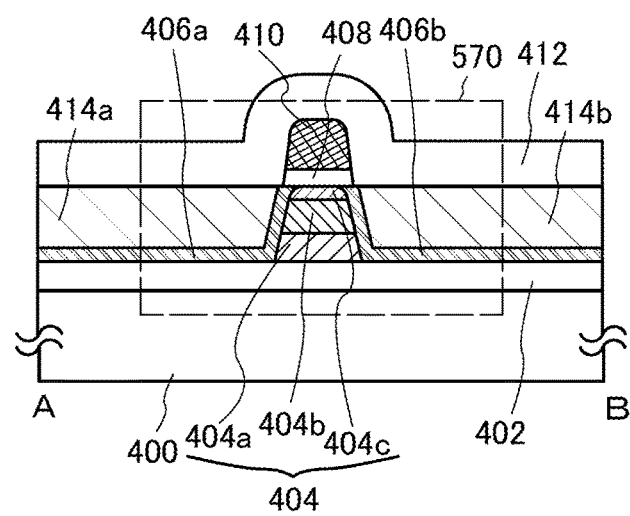
Figure 13C:
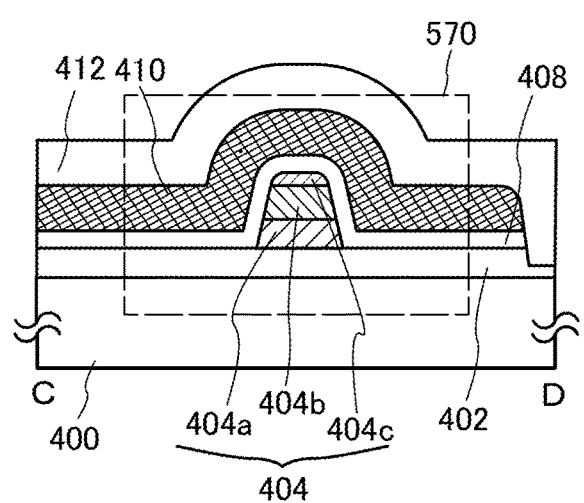

A transistor 570 illustrated in FIGS. 13A to 13C can be used. FIGS. 13A to 13C are a top view and cross-sectional views which illustrate the transistor 570. FIG. 13A is the top view. FIG. 13B illustrates a cross section taken along dashed-dotted line A-B in FIG. 13A. FIG. 13C illustrates a cross section taken along dashed-dotted line C-D in FIG. 13A. Note that for simplification of the drawing, some components in the top view in FIG. 13A are not illustrated.

In the transistor 570, overetching of the base insulating film 402 is suppressed when the first oxide semiconductor film 404a, the second oxide semiconductor film 404b, and the third oxide semiconductor film 404c are formed and thus the base insulating film 402 is not etched.

In order to prevent etching of the base insulating film 402 caused by overetching, the selectivity ratio of the oxide semiconductor film with respect to the base insulating film 402 is high.

Note that the conductive film 401 may be provided in FIGS. 13A to 13C as in FIGS. 12A to 12C.

Figure 14A:
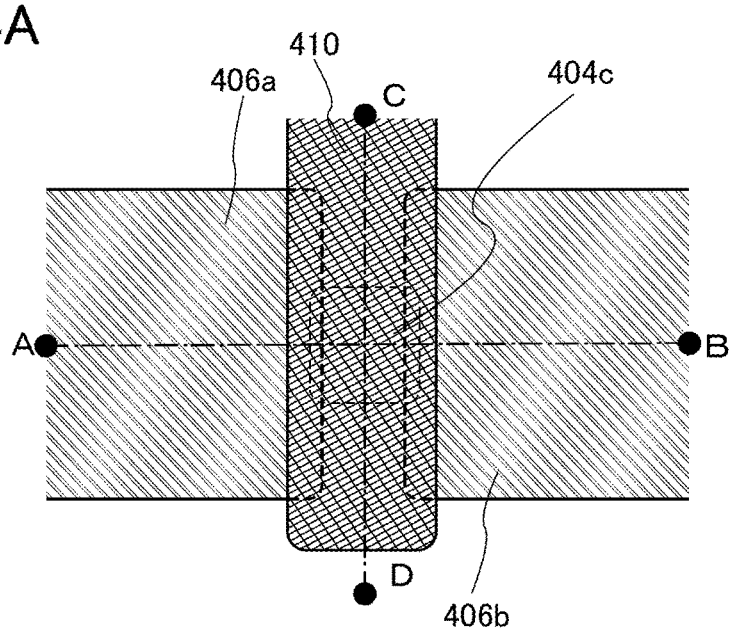
FIGS. 14A to 14C are a top view and cross-sectional views illustrating a transistor.
Figure 14B:
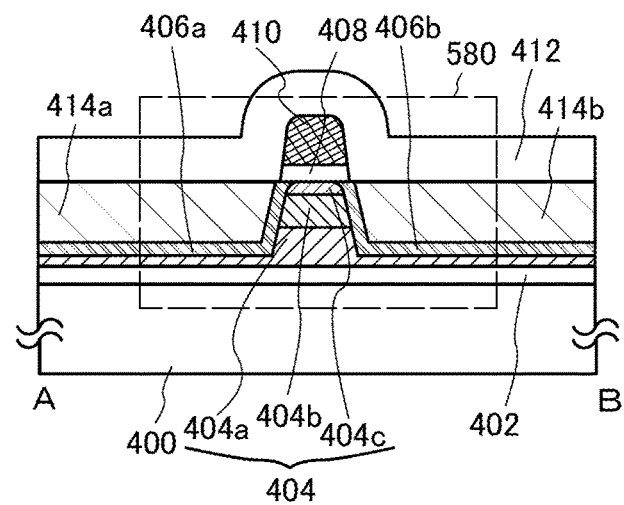
Figure 14C:
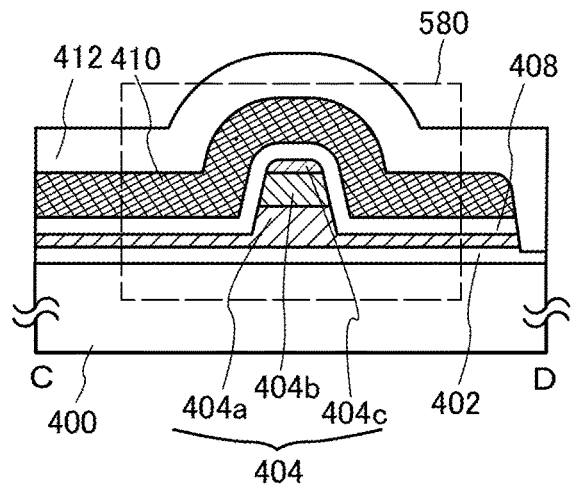

A transistor 580 illustrated in FIGS. 14A to 14C can be used. FIGS. 14A to 14C are a top view and cross-sectional views which illustrate the transistor 580. FIG. 14A is the top view. FIG. 14B illustrates a cross section taken along dashed-dotted line A-B in FIG. 14A. FIG. 14C illustrates a cross section taken along dashed-dotted line C-D in FIG. 14A. Note that for simplification of the drawing, some components are not illustrated in the top view of FIG. 14A.

In etching to form the first oxide semiconductor film 404a, the second oxide semiconductor film 404b, and the third oxide semiconductor film 404c of the transistor 580, the first oxide semiconductor film is not entirely etched to have a projected shape.

Note that the conductive film 401 may be provided in FIGS. 14A to 14C as in FIGS. 12A to 12C.

In this embodiment, the second oxide semiconductor film is sandwiched between the first oxide semiconductor film and the third oxide semiconductor film. However, the structure is not limited thereto; a structure without the first oxide semiconductor film or a structure with another oxide semiconductor film may be employed.

The electrode and the oxide semiconductor film may have angular end portions. In order to obtain the angular end portions, when a film is processed using a resist mask or a hard mask, the selectivity ratio of the film to be processed to the resist mask or the hard mask is set high. A specific structure example (a transistor 590) will be described with reference to FIGS. 15A to 15C.

Figure 15A:
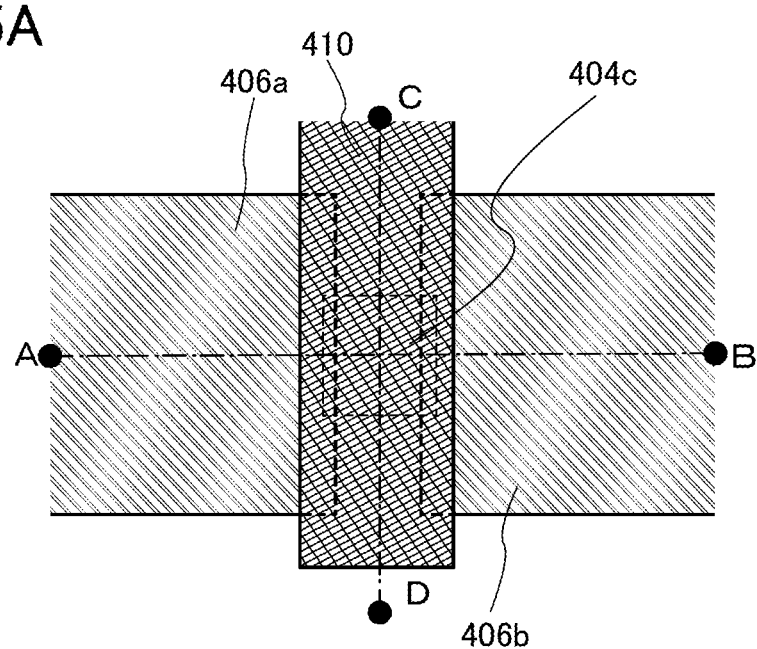
FIGS. 15A to 15C are a top view and cross-sectional views illustrating a transistor.
Figure 15B:
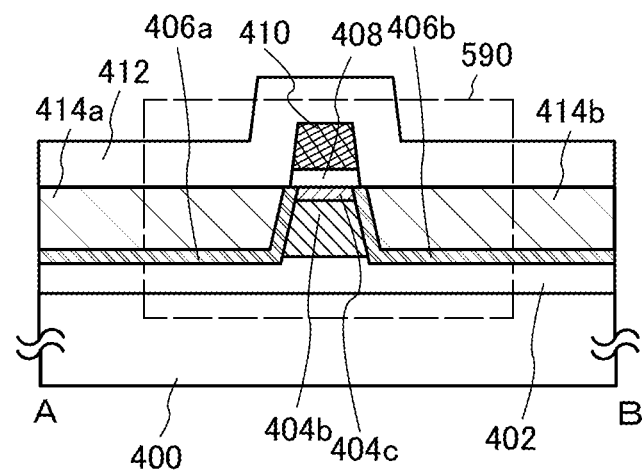
Figure 15C:
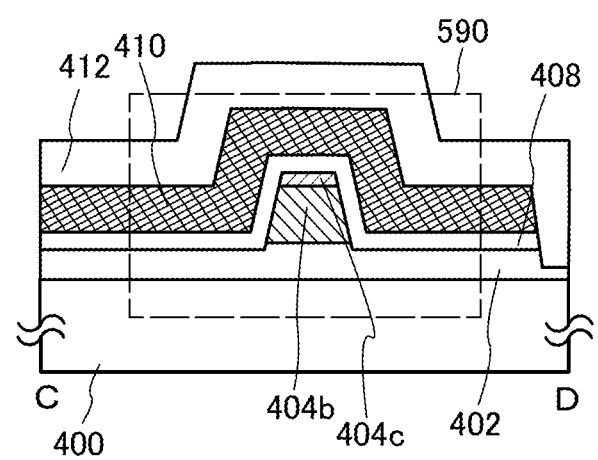

FIGS. 15A to 15C are a top view and cross-sectional views of the transistor 590. FIG. 15B illustrates a cross section taken along dashed-dotted line A-B in FIG. 15A. FIG. 15C illustrates a cross section taken along dashed-dotted line C-D in FIG. 15A. Note that for simplification of the drawing, some components are not illustrated in the top view of FIG. 15A.

In the transistor 590, only the second oxide semiconductor film 404b and the third oxide semiconductor film 404c are electrically surrounded by an electric field from the gate electrode.

Note that the conductive film 401 may be provided in FIGS. 15A to 15C as in FIGS. 12A to 12C.

This embodiment can be combined with any of the other embodiments in this specification as appropriate.

Embodiment 4

In this embodiment, a method for manufacturing the transistor 550 described in Embodiment 3 with reference to FIGS. 11A to 11C will be described with reference to FIGS. 16A to 16C and FIGS. 17A to 17C.

First, the base insulating film 402 is formed over the substrate 400. Then, the first oxide semiconductor film 404a, the second oxide semiconductor film 404b, and the third oxide semiconductor film 404c are formed over the base insulating film 402. Next, the first conductive film 405 to be the source electrode 406a and the drain electrode 406b is formed over the first oxide semiconductor film 404a, the second oxide semiconductor film 404b, and the third oxide semiconductor film 404c (see FIG. 16A). FIGS. 7A to 7C of Embodiment 2 can be referred to for manufacturing steps up to this stage.

Figure 16A:
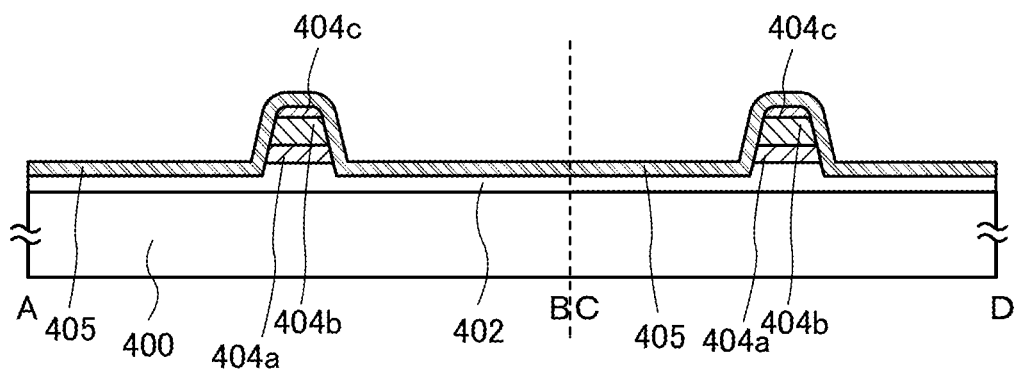
FIGS. 16A to 16C illustrate a method for manufacturing a transistor.
Figure 16B:
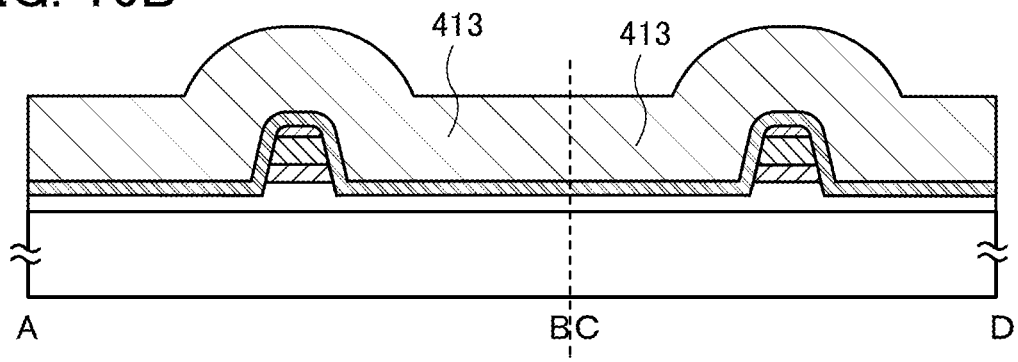

Next, an insulating film 413 is formed over the first conductive film 405 (see FIG. 16B). The insulating film 413 can be formed using a material similar to that of the base insulating film.

Figure 16C:
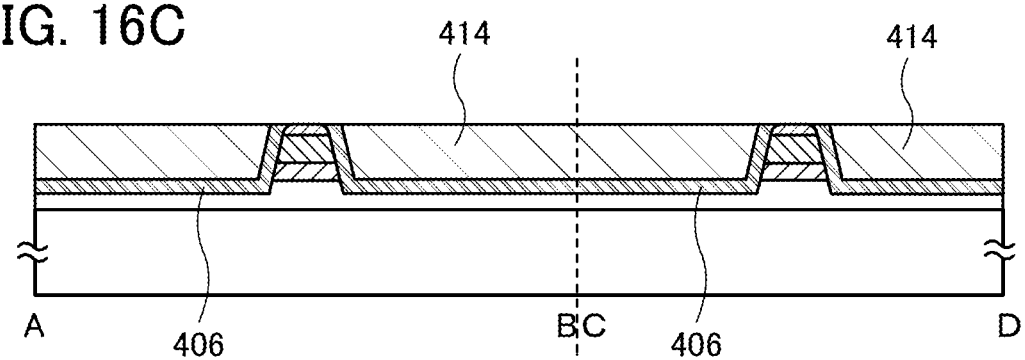

Then, removing (polishing) treatment is performed on the first conductive film 405 and the insulating film 413 to remove part of the first conductive film 405 and the insulating film 413 and expose the third oxide semiconductor film 404c, whereby a second conductive film 406 and an insulating film 414 are formed (see FIG. 16C).

For the removing treatment, chemical mechanical polishing (CMP) treatment can be preferably used. Another removing treatment may be used. Alternatively, the polishing treatment such as CMP treatment may be combined with etching (dry etching or wet etching) treatment or plasma treatment. For example, after the CMP treatment, dry etching treatment or plasma treatment (e.g., reverse sputtering) may be performed in order to improve the flatness of a surface to be processed. When the removing treatment is combined with etching treatment, plasma treatment, or the like, the order of steps may be, without any particular limitation, determined as appropriate depending on the material, thicknesses, and surface roughness. Alternatively, a large part of the first conductive film 405 and the insulating film 413 may be removed by CMP treatment and the other part of the first conductive film 405 and the insulating film 413 may be removed by dry etching treatment.

Note that CMP treatment may be performed only once or plural times. When CMP treatment is performed plural times, first polishing is preferably performed with a high polishing rate followed by final polishing with a low polishing rate. By combining polishing treatment with different polishing rates, the flatness of the surfaces of the first conductive film 405 and the insulating film 413 can be further increased.

Figure 17A:
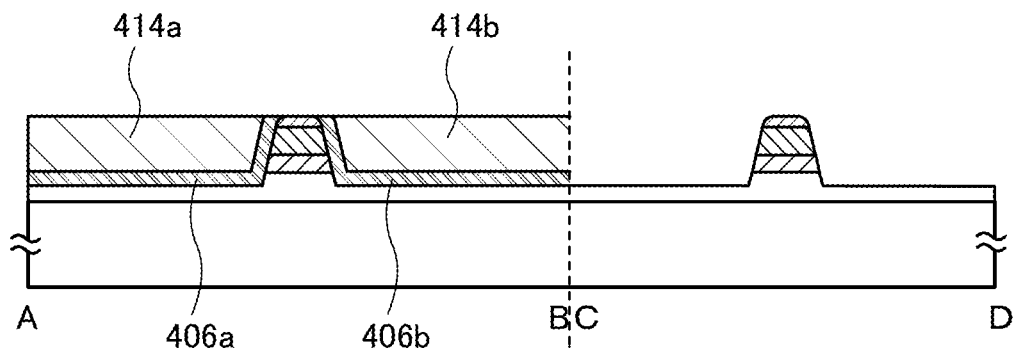
FIGS. 17A to 17C illustrate a method for manufacturing a transistor.

Then, the second conductive film 406 and the insulating film 414 are divided by etching to form the source electrode 406a, the drain electrode 406b, the insulating film 414a, and the insulating film 414b (see FIG. 17A). In this embodiment, the top surface of the third oxide semiconductor film is aligned with the top surface of the source and drain electrodes. Note that one embodiment is not limited to this structure; the top surface of the source and drain electrodes may be lower than the top surface of the third oxide semiconductor film. The base insulating film 402 may be further etched in the C-D direction than in the A-B direction when the second conductive film 406 is etched.

Figure 17B:
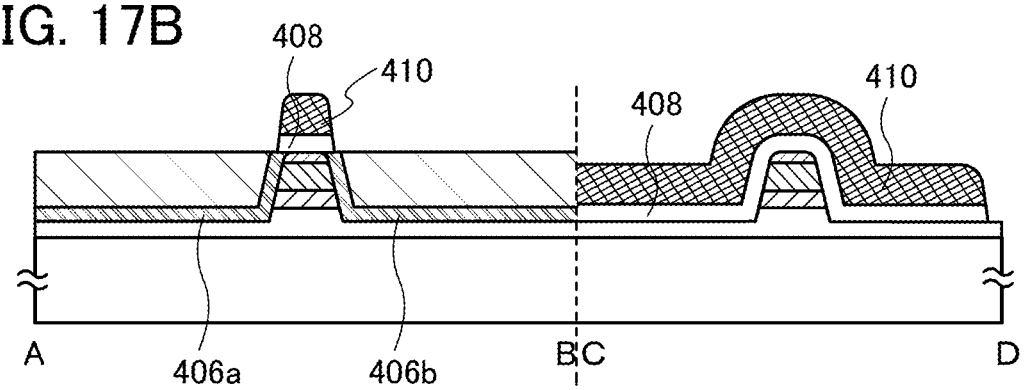

Next, the gate insulating film 408 and the gate electrode 410 are formed over the third oxide semiconductor film 404c, the source electrode 406a, and the drain electrode 406b (see FIG. 17B). Embodiment 2 can be referred to for the materials and formation methods of the gate insulating film 408 and the gate electrode 410.

The gate insulating film 408 and the gate electrode 410 may be formed in the following manner: an insulating film to be the gate insulating film 408 and a conductive film to be the gate electrode 410 are formed by a CVD method, the conductive film to be the gate electrode 410 is selectively etched to form the gate electrode 410, and the gate insulating film 408 is formed using the gate electrode 410 as a mask. In this manner, the insulating film to be the gate insulating film 408 and the conductive film to be the gate electrode 410 can be successively formed.

Figure 17C:
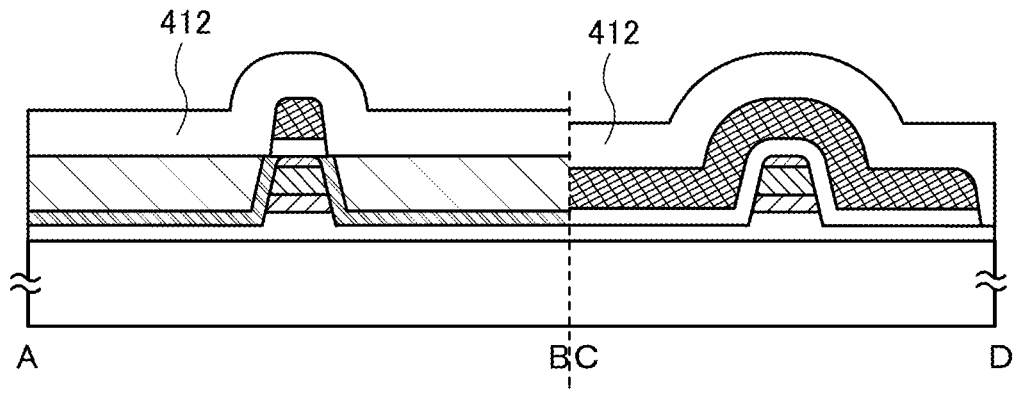

Lastly, the oxide insulating film 412 is formed over the insulating film 414a, the insulating film 414b, the source electrode 406a, the drain electrode 406b, the gate insulating film 408, and the gate electrode 410 (see FIG. 17C). Embodiment 2 can be referred to for materials and formation methods of the oxide insulating film 412.

Through the above process, the transistor 550 illustrated in FIGS. 11A to 11C can be fabricated.

This embodiment can be combined with any of the other embodiments in this specification as appropriate.

Embodiment 5

Figure 21A:
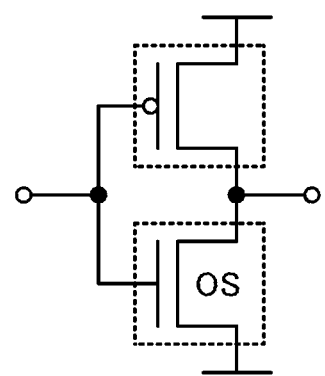
FIGS. 21A to 21D each illustrate an inverter including a semiconductor device of one embodiment of the present invention.
Figure 21B:
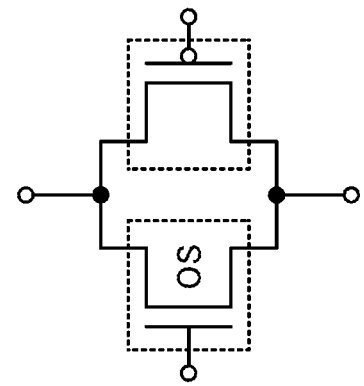
Figure 21C:
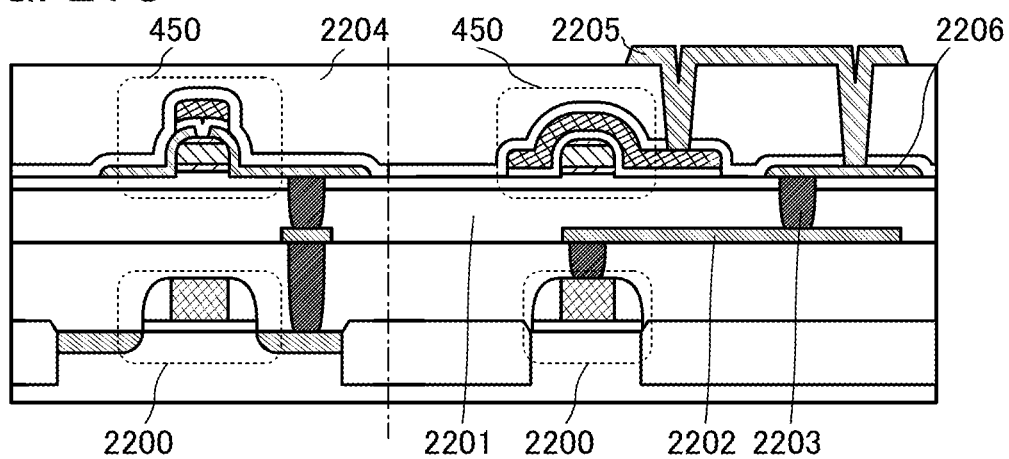
Figure 21D:
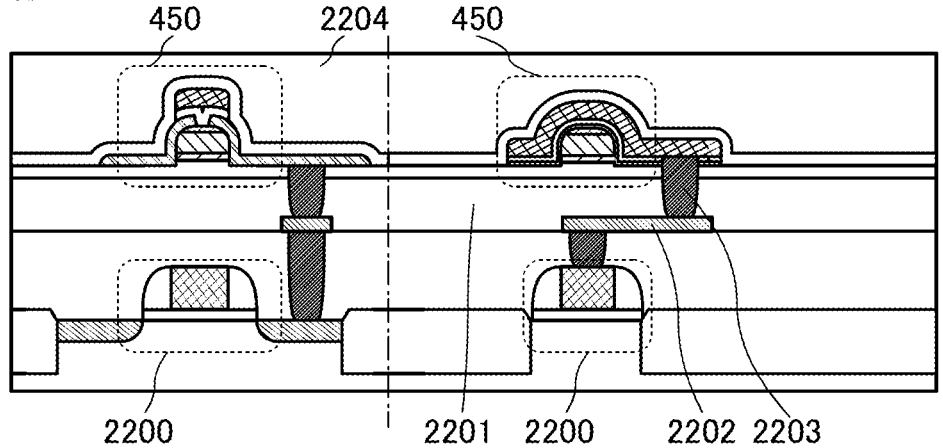

In this embodiment, an example of a circuit including the transistor of one embodiment of the present invention is described with reference to the drawings. FIGS. 21A and 21B are each a circuit diagram of a semiconductor device and FIGS. 21C and 21D are each a cross-sectional view of a semiconductor device. FIGS. 21C and 21D each illustrate a cross-sectional view of the transistor 450 in a channel length direction on the left side of a dashed-dotted line and a cross-sectional view of the transistor 450 in a channel width direction on the right side of the dashed-dotted line. In the circuit diagram, "OS" is written beside a transistor in order to clearly demonstrate that the transistor includes an oxide semiconductor.

The semiconductor devices illustrated in FIGS. 21C and 21D each include a transistor 2200 containing a first semiconductor material in a lower portion and a transistor containing a second semiconductor material in an upper portion. Here, an example is described in which the transistor 450 described in Embodiment 1 as an example is used as the transistor containing the second semiconductor material.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in Embodiment 1 can be used as the second semiconductor material. A transistor using a material other than an oxide semiconductor, such as single crystal silicon, can operate at high speed easily. In contrast, a transistor including an oxide semiconductor has the low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, does not need to be limited to that described here except for the use of the transistor described in Embodiment 1, which is formed using an oxide semiconductor.

FIGS. 21A, 21C, and 21D each illustrate a configuration example of what is called a CMOS circuit, in which a p-channel transistor and an n-channel transistor are connected in series and gates of the transistors are connected.

The transistor using an oxide semiconductor of one embodiment of the present invention has a high on-state current, which can achieve high-speed operation of a circuit.

In the structure illustrated in FIG. 21C, the transistor 450 is provided over the transistor 2200 with an insulating film 2201 positioned therebetween. Wirings 2202 are provided between the transistor 2200 and the transistor 450. Wirings and electrodes in the upper layer and the lower layer are electrically connected via plugs 2203 embedded in insulating films. An insulating film 2204 covering the transistor 450, a wiring 2205 over the insulating film 2204, and a wiring 2206 formed by processing the same conductive film as the pair of electrodes of the transistor are provided.

By stacking two transistors in the above manner, an area occupied by a circuit can be reduced; accordingly, a plurality of circuits can be arranged in high density.

In FIG. 21C, one of the source and the drain of the transistor 450 is electrically connected to one of a source and a drain of the transistor 2200 via the wiring 2202 and the plug 2203. The gate of the transistor 450 is electrically connected to a gate of the transistor 2200 via the wiring 2205, the wiring 2206, the plug 2203, the wiring 2202, and the like.

In the configuration illustrated in FIG. 21D, an opening portion in which the plug 2203 is embedded is provided in a gate insulating film of the transistor 450, and the gate of the transistor 450 is in contact with the plug 2203 through the opening portion. Such a configuration makes it possible to achieve the integration of the circuit easily and to reduce the lengths and the number of wirings and plugs used to be smaller than those in the configuration illustrated in FIG. 21C; thus, the circuit can operate at higher speed.

Note that when a connection between the electrodes of the transistor 450 and the transistor 2200 is changed from that in the configuration illustrated in FIG. 21C or FIG. 21D, a variety of circuits can be formed. For example, a circuit having a configuration in which a source and a drain of a transistor are connected to those of another transistor as illustrated in FIG. 21B can operate as what is called an analog switch.

A semiconductor device having an image sensor function for reading data of an object can be fabricated with the use of the transistor described in any of the above embodiments.

Figure 22:
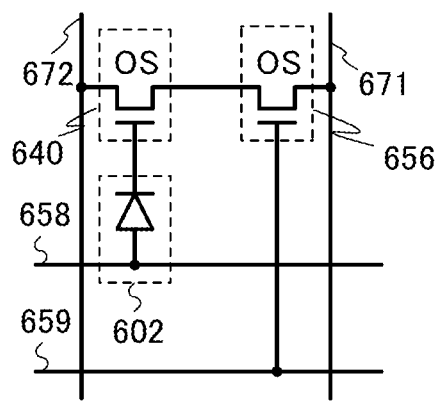
FIG. 22 is an equivalent circuit diagram illustrating an example of a semiconductor device.

FIG. 22 illustrates an example of an equivalent circuit of a semiconductor device having an image sensor function.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

As the photodiode 602, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 602, data on an object to be detected can be read. Note that a light source such as a backlight can be used at the time of reading data of an object.

As each of the transistor 640 and the transistor 656, the transistor in which a channel is formed in an oxide semiconductor, which is described in any of the above embodiments, can be used. In FIG. 22, "OS" is written beside the transistor 640 and the transistor 656 so that the transistors 640 and 656 can be identified as transistors including an oxide semiconductor.

It is preferable that each of the transistor 640 and the transistor 656 be one of the transistors described in the above embodiments, in which the oxide semiconductor film is electrically surrounded by an electric field from the gate electrode. When the oxide semiconductor film has round end portions and a curved surface in the transistor, coverage with a film formed over the oxide semiconductor film can be improved. In addition, electric field concentration which might occur at end portions of the source electrode and the drain electrode can be reduced, which can suppress deterioration of the transistor. Therefore, variation in the electrical characteristics of the transistor 640 and the transistor 656 is suppressed, and the transistor 640 and the transistor 656 are electrically stable. The semiconductor device having an image sensor function illustrated in FIG. 22 can have high reliability by including the transistor.

This embodiment can be combined with any of the other embodiments in this specification as appropriate.

Embodiment 6

In this embodiment, an example of a semiconductor device (memory device) which includes a transistor according to one embodiment of the present invention, which can hold stored data even when not powered, and which has an unlimited number of write cycles will be described with reference to drawings.

Figure 23:
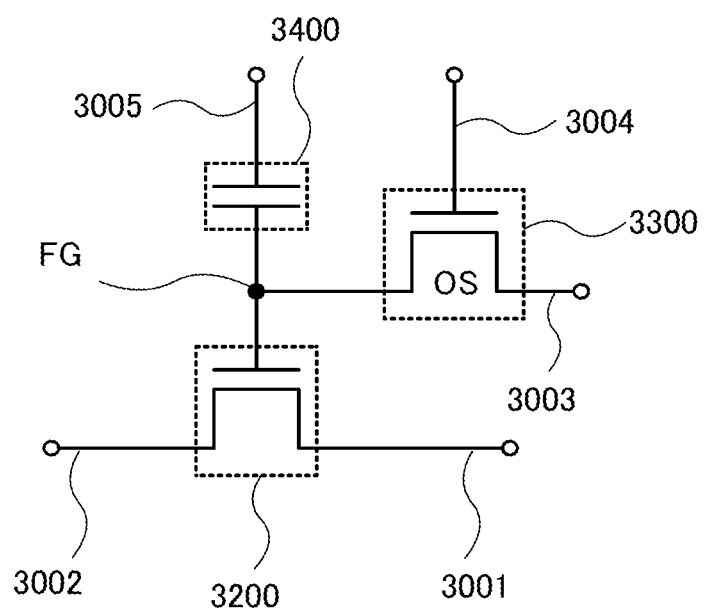
FIG. 23 is a circuit diagram of a semiconductor device of one embodiment.

FIG. 23 is a circuit diagram of the semiconductor device.

The semiconductor device illustrated in FIG. 23 includes a transistor 3200 including a first semiconductor material, a transistor 3300 including a second semiconductor material, and a capacitor 3400. As the transistor 3300, the transistor described in Embodiment 1 can be used.

The transistor 3300 is a transistor in which a channel is formed in a semiconductor layer including an oxide semiconductor. Since the off-state current of the transistor 3300 is low, stored data can be retained for a long period owing to such a transistor. In other words, power consumption can be sufficiently reduced because a semiconductor device in which refresh operation is unnecessary or the frequency of refresh operation is extremely low can be provided.

In FIG. 23, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. The gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 23 utilizes a characteristic in which the potential of the gate electrode of the transistor 3200 can be held, and thus enables writing, storing, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Since the off-state current of the transistor 3300 is extremely low, the charge of the gate electrode of the transistor 3200 is held for a long time.

Next, reading of data will be described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge is given to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$($<V_{th\_L}$), the transistor 3200 remains off. Therefore, the data stored in the gate electrode layer can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential larger than $V_{th\_L}$ may be applied to the fifth wiring 3005.

When a transistor having a channel formation region formed using an oxide semiconductor and having an extremely low off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

As described above, a miniaturized and highly integrated semiconductor device having favorable electrical characteristics can be provided.

Embodiment 7

In this embodiment, a CPU in which at least the transistor described in any of the above embodiments can be used and the storage device described in the above embodiment is included is described.

Figure 24:
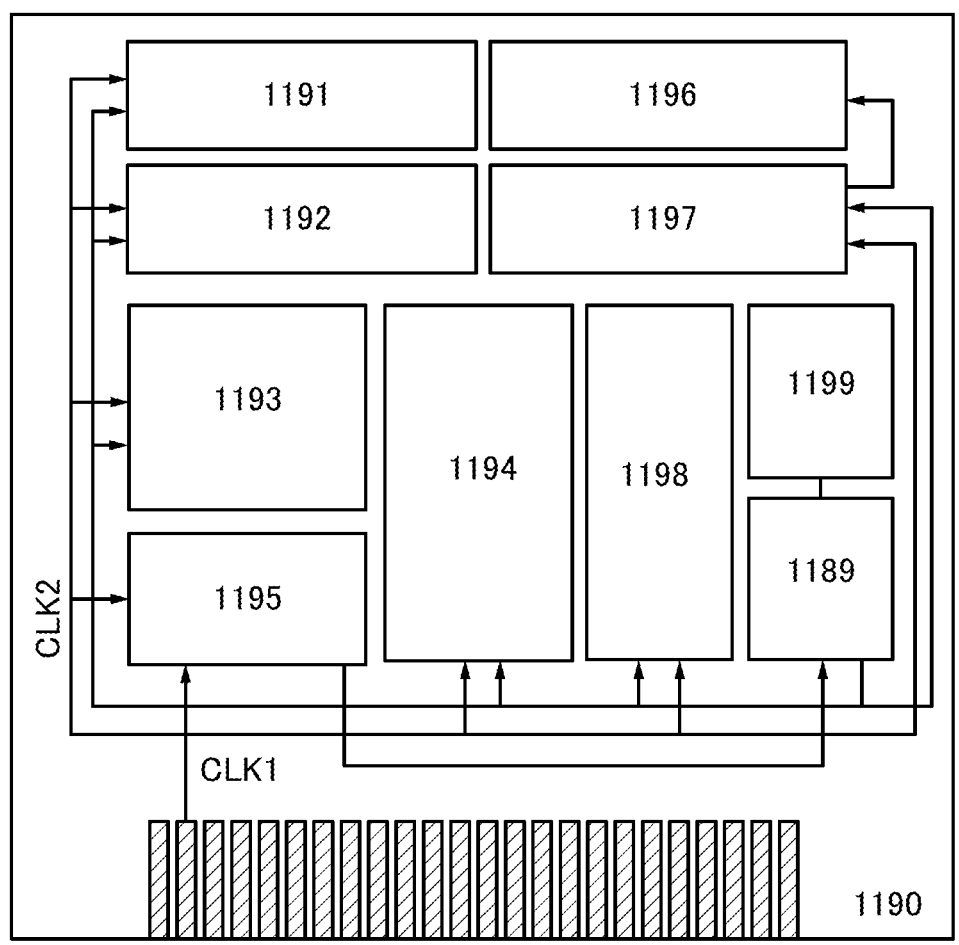
FIG. 24 is a block diagram of a semiconductor device of one embodiment.

FIG. 24 is a block diagram illustrating a configuration example of a CPU at least partly including the transistor described in Embodiment 1 or Embodiment 3.

The CPU illustrated in FIG. 24 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The rewritable ROM 1199 and the ROM interface 1189 may be provided over a separate chip. Obviously, the CPU illustrated in FIG. 24 is only an example in which the structure is simplified, and an actual CPU may have various structures depending on the application. For example, the CPU may have the following configuration: a structure including the CPU illustrated in FIG. 24 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 24, a memory cell is provided in the register 1196. For the memory cell of the register 1196, any of the transistors described in the above embodiments can be used.

In the CPU illustrated in FIG. 24, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 25:
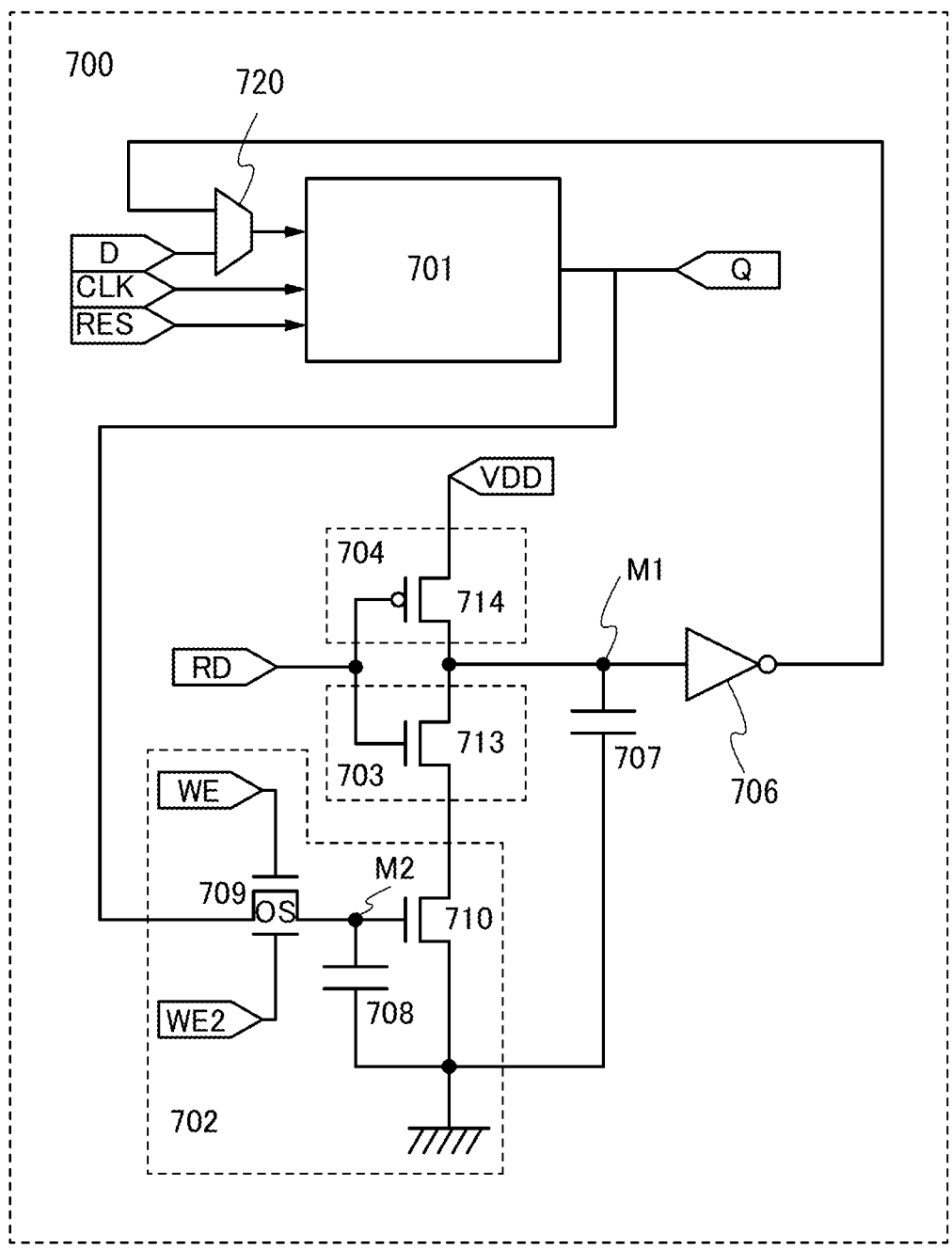
FIG. 25 is a circuit diagram of a storage device of one embodiment.

FIG. 25 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in the above embodiment can be used as the circuit 702. When supply of the power supply voltage to the memory element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

Illustrated is an example in which the switch 703 is a transistor 713 having one conductivity type (e.g., an n-channel transistor) and the switch 704 is a transistor 714 having a conductivity type opposite to the one conductivity type (e.g., a p-channel transistor). Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 25 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 25, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 25, any of the transistors described in Embodiment 1 can be used. The transistor 709 preferably includes a second gate (second gate electrode). The control signal WE can be input to the first gate and the control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 (drain current when a gate voltage of the transistor is 0 V) can be further decreased. Note that as the transistor 709, the transistor without the second gate can be used.

Further, in FIG. 25, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor film can be used for all the transistors used for the memory element 700. Further alternatively, in the memory element 700, a transistor in which a channel is formed in an oxide semiconductor film can be included besides the transistor 709, and a transistor in which a channel is formed in a layer or the substrate 1190 including a semiconductor other than an oxide semiconductor can be used for the reset of the transistors.

As the circuit 701 in FIG. 25, for example, a flip-flop circuit can be used. As the logic element 706, for example, an inverter, a clocked inverter, or the like can be used.

In the driving method of the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs the above pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Furthermore, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although an example in which the storage element 700 is used in a CPU is described in this embodiment, the storage element 700 can also be used in a digital signal processor (DSP), a custom LSI, an LSI such as a programmable logic device (PLD), and a radio frequency identification (RF-ID).

This embodiment can be combined with any of the other embodiments disclosed in this specification as appropriate.

Embodiment 8

The semiconductor device of one embodiment of the present invention can be used for display devices, personal computers, image reproducing devices provided with recording media (devices which reproduce the content of recording media such as digital versatile discs (DVDs) and have displays for displaying the reproduced images, as typical examples), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of such electronic devices are illustrated in FIGS. 26A to 26F.

Figure 26A:
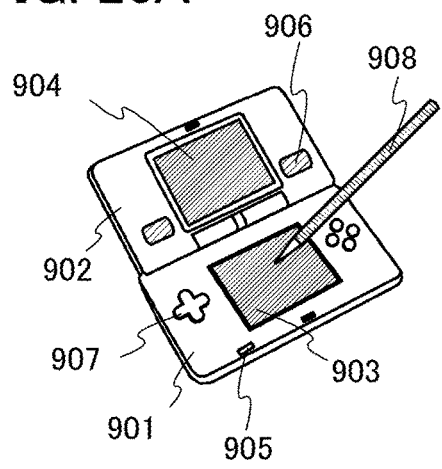
FIGS. 26A to 26F each illustrate an electronic device of one embodiment.

FIG. 26A illustrates a portable game console including a housing 901, a housing 902, a display portion 903, a display portion 904, a microphone 905, a speaker 906, an operation key 907, a stylus 908, and the like. Although the portable game machine in FIG. 26A has the two display portions 903 and 904, the number of display portions included in a portable game machine is not limited to this.

Figure 26B:
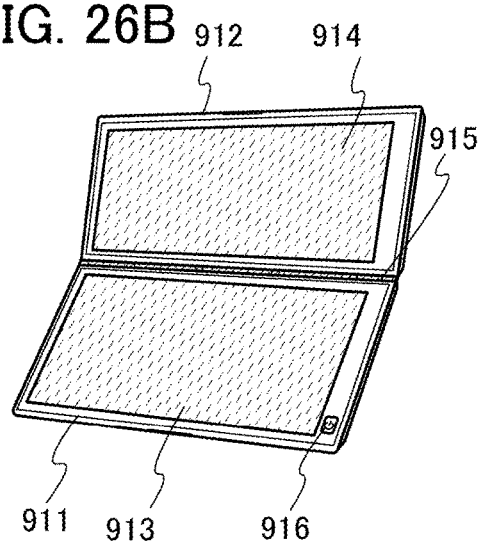

FIG. 26B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel area of a display device.

Figure 26C:
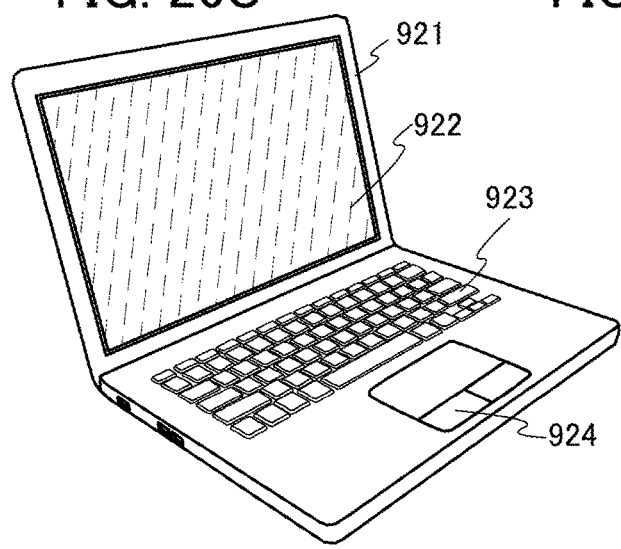

FIG. 26C illustrates a notebook personal computer, which includes a housing 921, a display portion 922, a keyboard 923, a pointing device 924, and the like.

Figure 26D:
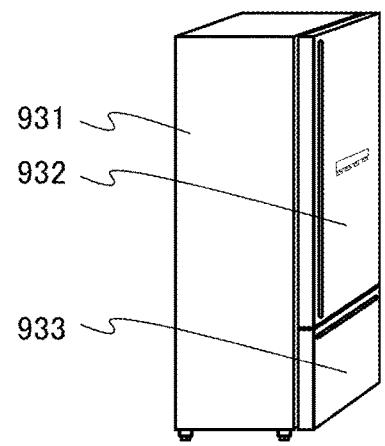

FIG. 26D illustrates the electric refrigerator-freezer including a housing 931, a door for a refrigerator 932, a door for a freezer 933, and the like.

Figure 26E:
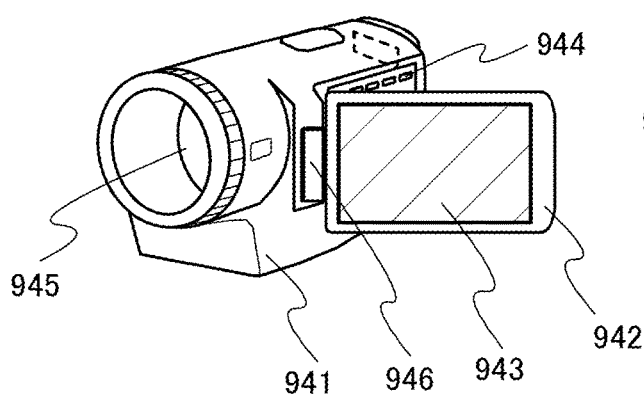

FIG. 26E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 26F:
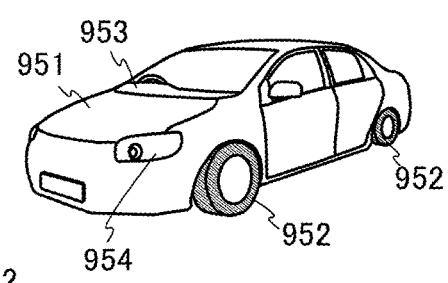
Figure 27A:
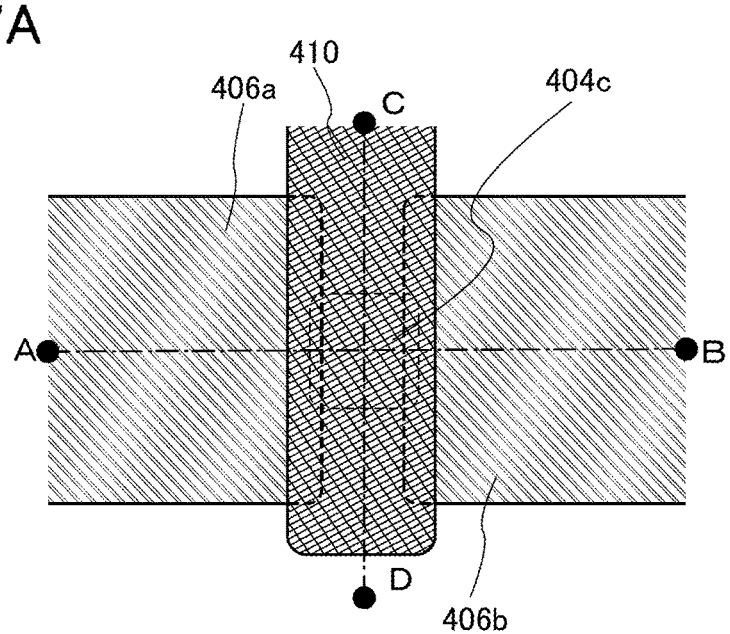
FIGS. 27A to 27C are a top view and cross-sectional views illustrating a transistor.
Figure 27B:
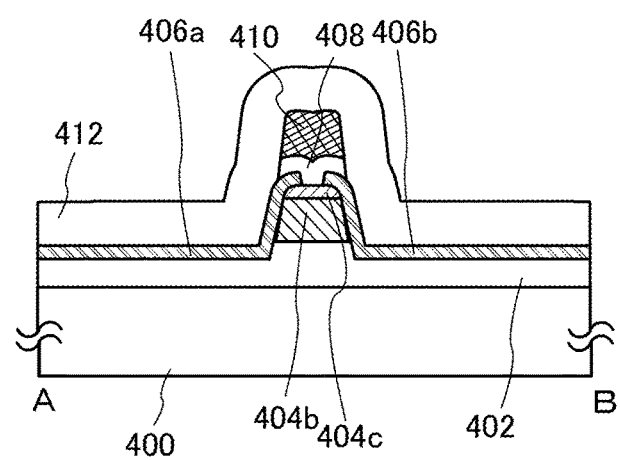
Figure 27C:
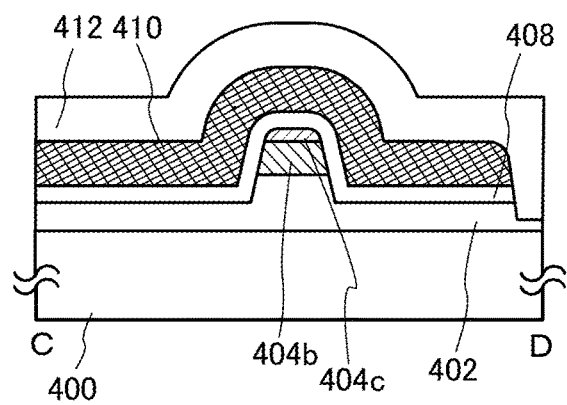
Figure 28A:
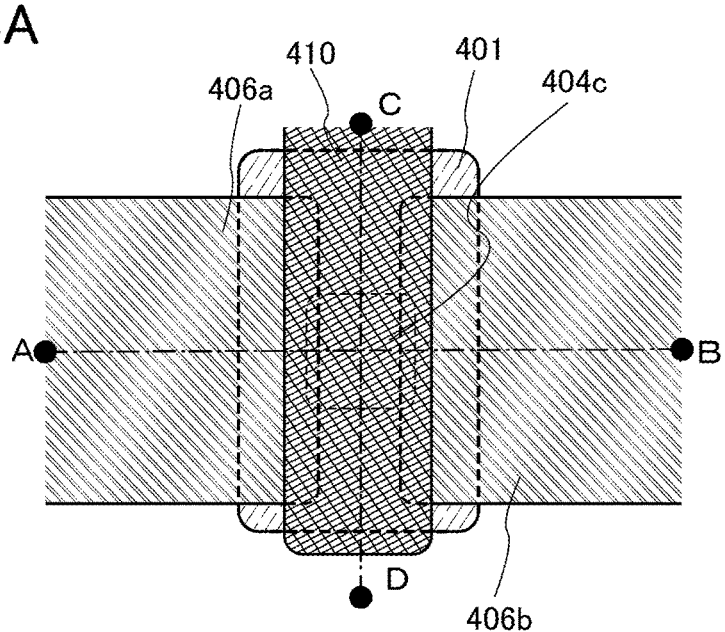
FIGS. 28A to 28C are a top view and cross-sectional views illustrating a transistor.
Figure 28B:
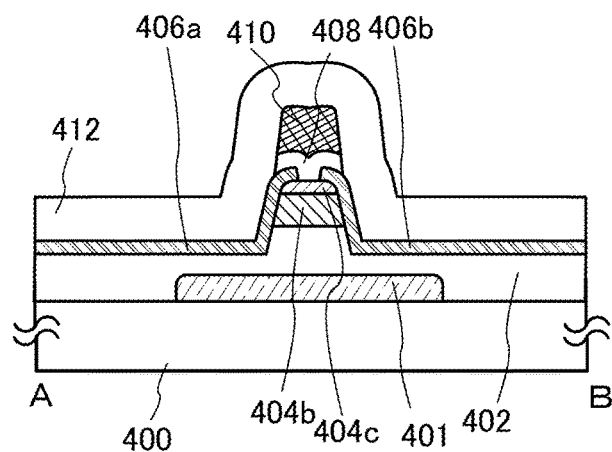
Figure 28C:
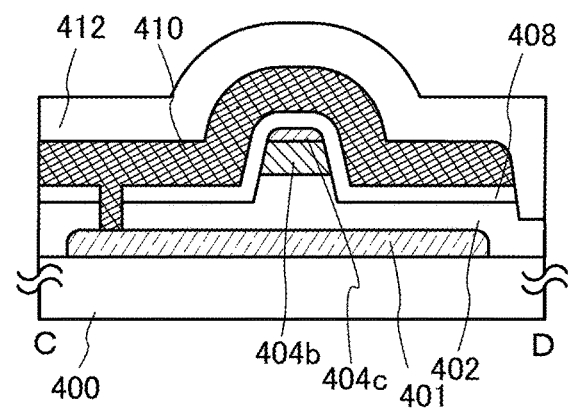

FIG. 26F illustrates an ordinary vehicle including a car body 951, wheels 952, a dashboard 953, lights 954, and the like.

This embodiment can be combined with any of the other embodiments disclosed in this specification as appropriate.

This application is based on Japanese Patent Application serial no. 2013-161960 filed with Japan Patent Office on Aug. 5, 2013, the entire contents of which are hereby incorporated by reference.

What is claimed is:
1. A semiconductor device comprising:
a first oxide semiconductor film over an insulating surface;
a second oxide semiconductor film over the first oxide semiconductor film;
a third oxide semiconductor film over the second oxide semiconductor film;
a source electrode and a drain electrode each in direct contact with side surfaces of the first oxide semiconductor film, the second oxide semiconductor film, and the third oxide semiconductor film and a portion of a top surface of the third oxide semiconductor film;
a gate insulating film over the third oxide semiconductor film, the source electrode, and the drain electrode;
a gate electrode over and in direct contact with the gate insulating film; and an oxide insulating film over and in direct contact with the source electrode, the drain electrode, a side surface of the gate insulating film, and the gate electrode, wherein the gate electrode faces a top surface and a side surface of the second oxide semiconductor film and a portion of a side surface of the first oxide semiconductor film with at least the gate insulating film interposed therebetween, and wherein a length of a region where the second oxide semiconductor film and the source electrode or the drain electrode overlap with each other in a channel length direction is shorter than twice a length between the source electrode and the drain electrode on the third oxide semiconductor film.

2. The semiconductor device according to claim 1, wherein the oxide insulating film comprises excess oxygen.

3. The semiconductor device according to claim 1, wherein an oxide semiconductor having higher electron affinity than the first oxide semiconductor film and the third oxide semiconductor film is used for the second oxide semiconductor film.

4. The semiconductor device according to claim 1, wherein the first oxide semiconductor film is over a projected portion of the insulating surface.

5. The semiconductor device according to claim 1, wherein end portions of the third oxide semiconductor film are rounded to have curved surfaces.

6. The semiconductor device according to claim 1, wherein a length of the third oxide semiconductor film in the channel length direction is shorter than a length of the gate electrode in the channel length direction.

7. A semiconductor device comprising:
a first oxide semiconductor film over an insulating surface;
a second oxide semiconductor film over the first oxide semiconductor film;
a third oxide semiconductor film over the second oxide semiconductor film;
a source electrode and a drain electrode, a first surface of the source electrode and a first surface of the drain electrode each being in direct contact with side surfaces of the first oxide semiconductor film, the second oxide semiconductor film, and the third oxide semiconductor film;
a first insulating film over and in direct contact with a second surface of the source electrode;
a second insulating film over and in direct contact with a second surface of the drain electrode;
a gate insulating film over the third oxide semiconductor film, the source electrode, and the drain electrode; and
a gate electrode over and in direct contact with the gate insulating film,
wherein the gate electrode faces a top surface and a side surface of the second oxide semiconductor film and a portion of a side surface of the first oxide semiconductor film with at least the gate insulating film interposed therebetween.

8. The semiconductor device according to claim 7, wherein a top surface of the third oxide semiconductor film is positioned at the same level as top surfaces of the source electrode and the drain electrode.

9. The semiconductor device according to claim 7, further comprising an oxide insulating film over the source electrode, the drain electrode, the first insulating film, the second insulating film, and the gate electrode, the oxide insulating film being in direct contact with the first insulating film and the second insulating film.

10. The semiconductor device according to claim 7, wherein an oxide semiconductor having higher electron affinity than the first oxide semiconductor film and the third oxide semiconductor film is used for the second oxide semiconductor film.

11. The semiconductor device according to claim 7, wherein the first oxide semiconductor film is over a projected portion of the insulating surface.

12. The semiconductor device according to claim 7, wherein end portions of the third oxide semiconductor film are rounded to have curved surfaces.

13. The semiconductor device according to claim 7, wherein a length of the third oxide semiconductor film is shorter than a length of the gate electrode in a channel length direction.

* * * * *